US012446246B2

(12) United States Patent
Afzalian et al.

(10) Patent No.: US 12,446,246 B2
(45) Date of Patent: Oct. 14, 2025

(54) FIELD-EFFECT TRANSISTOR DEVICE

(71) Applicant: IMEC VZW, Leuven (BE)

(72) Inventors: Aryan Afzalian, Chastre (BE); Julien Ryckaert, Schaerbeek (BE); Naoto Horiguchi, Leuven (BE)

(73) Assignee: IMEC VZW, Leuven (BE)

( * ) Notice: Subject to any disclaimer, the term of this patent is extended or adjusted under 35 U.S.C. 154(b) by 476 days.

(21) Appl. No.: 18/060,954

(22) Filed: Dec. 1, 2022

(65) Prior Publication Data

US 2023/0178640 A1 Jun. 8, 2023

(30) Foreign Application Priority Data

Dec. 3, 2021 (EP) .................................... 21212147

(51) Int. Cl.
*H01L 29/775* (2006.01)
*H01L 21/8238* (2006.01)
(Continued)

(52) U.S. Cl.
CPC ........... *H10D 30/43* (2025.01); *H10D 30/014* (2025.01); *H10D 30/6735* (2025.01);
(Continued)

(58) Field of Classification Search
CPC .. H10D 30/43; H10D 30/014; H10D 30/6735; H10D 62/121; H10D 62/151;
(Continued)

(56) References Cited

U.S. PATENT DOCUMENTS 11,164,942 B1  11/2021  Weckx et al.
2016/0111337 A1  4/2016  Hatcher et al.
(Continued)

FOREIGN PATENT DOCUMENTS

WO  2021/232916 A1  11/2021

OTHER PUBLICATIONS

Extended European Search Report for European Patent Application No. 21212147.9, mailed May 10, 2022.
(Continued)

*Primary Examiner* — Tong-Ho Kim
(74) *Attorney, Agent, or Firm* — MCDONNELL BOEHNEN HULBERT & BERGHOFF LLP

(57) ABSTRACT

A FET device (100) is provided, the FET device including a substrate (102), a source body (120), a drain body (130) and a set of vertically spaced apart channel layers (150) extending between the source and drain body in a first direction along the substrate (102), the source body (120) comprising a common source body portion (122) arranged at a first lateral side of the set of channel layers (150) and a set of vertically spaced apart source prongs (124) protruding from the common source body portion (122) in a second direction along the substrate (102), transverse to the first direction, the drain body (130) comprising a common source body portion (132) arranged at the first lateral side of the set of channel layers (150) and a set of drain prongs (134) protruding from the common drain body portion (132) in the second direction; and a gate body (140) comprising a common gate body portion (142) arranged at a second lateral side of the channel layer (150), opposite the first lateral side, and a set of gate prongs (144) protruding from the common gate body gate portion (142) in a third direction along the substrate (102), opposite the first direction; wherein each channel layer (150) comprises a first side (150aa, 150ba) and an opposite second side (150ab, 150bb), the first side arranged in abutment with a topside or an underside of a pair of source and drain prongs (124a, 134a) and the second side (150ab, 150bb) facing a gate prong (144a, 144b).

22 Claims, 19 Drawing Sheets

(51) Int. Cl.
  *H01L 27/092* (2006.01)
  *H01L 29/06* (2006.01)
  *H01L 29/08* (2006.01)
  *H01L 29/423* (2006.01)
  *H01L 29/66* (2006.01)
  *H10D 30/01* (2025.01)
  *H10D 30/43* (2025.01)
  *H10D 30/67* (2025.01)
  *H10D 62/10* (2025.01)
  *H10D 62/13* (2025.01)
  *H10D 84/01* (2025.01)
  *H10D 84/03* (2025.01)
  *H10D 84/85* (2025.01)

(52) U.S. Cl.
  CPC ......... *H10D 62/121* (2025.01); *H10D 62/151* (2025.01); *H10D 84/0167* (2025.01); *H10D 84/017* (2025.01); *H10D 84/038* (2025.01); *H10D 84/85* (2025.01)

(58) Field of Classification Search
  CPC ............. H10D 84/0167; H10D 84/017; H10D 84/038; H10D 84/85; H10D 30/6757; H10D 64/518; H10D 62/116; H10D 64/256; H10D 64/517; H10D 84/0172; H10D 84/0193; H10D 84/853; H10D 30/62; B82Y 10/00
  USPC ....................................................... 257/351
  See application file for complete search history.

(56) References Cited

U.S. PATENT DOCUMENTS

2019/0122937 A1    4/2019  Cheng et al.
2021/0082766 A1    3/2021  Miura et al.
2021/0375926 A1*  12/2021  Mehandru .............. H10B 51/20
2021/0376076 A1*  12/2021  Su ........................ H10D 30/014

OTHER PUBLICATIONS

Weckx et al., "Novel forksheet device architecture as ultimate logic scaling device towards 2nm," 2019 IEEE International Electron Devices Meeting (IEDM), IEEE, Dec. 7, 2019, XP033714586.

* cited by examiner

FIELD-EFFECT TRANSISTOR DEVICE

CROSS-REFERENCE

This application claims priority from European patent application no. EP 21212147.9, filed on Dec. 3, 2021, which is incorporated by reference in its entirety.

TECHNICAL FIELD

The present disclosure concept relates to a field-effect transistor (FET) device.

Background of the Present Disclosure

Moore's law, that sets the footprint area of a transistor to scale by a factor 2, i.e. the transistor gate length L to scale by a factor $\sqrt{2}$, every 2 years, has been the driving force of the electronic industry, scaling the length of a transistor to its limits. Today, the minimal distance between the gate of two subsequent transistors, a measure known as contacted poly pitch (CPP) or gate pitch (CGP), has been scaled to approximately 50 nm. Device parameters limiting further CPP scaling include gate length, source/drain contact area and gate spacer width.

Summary of the Present Disclosure

An objective of the present disclosure is to enable further CPP scaling. Additional and alternative objectives may be understood from the following.

According to an aspect of the present disclosure, a FET device is provided, the FET device comprising:
- a substrate, a source body, a drain body and a set of vertically spaced apart channel layers extending between the source and drain body in a first direction along the substrate,
    - the source body comprising a common source body portion arranged at a first lateral side of the set of channel layers and a set of vertically spaced apart source prongs protruding from the common source body portion in a second direction along the substrate, transverse to the first direction,
    - the drain body comprising a common drain body portion arranged at the first lateral side of the set of channel layers and a set of drain prongs protruding from the common drain body portion in the second direction; and
- a gate body comprising a common gate body portion arranged at a second lateral side of the set of channel layers, opposite the first lateral side, and a set of gate prongs protruding from the common gate body gate portion in a third direction along the substrate, opposite the first direction;
- wherein each channel layer comprises a first side and an opposite second side, the first side arranged in abutment with a topside or an underside of a pair of source and drain prongs and the second side facing a gate prong.

According to one aspect of the presently disclosed device, the common gate body portion may be located on a laterally opposite side to the common source and drain body portions, with respect to the set of channel layers. In other words, the common gate body portion may be laterally/horizontally offset with respect to the common source and drain body portions. Meanwhile, the gate prongs may be offset vertically with respect to the source and drain prongs. In other words, the source and drain prongs and the gate prongs may be located at different vertical levels (e.g. above the substrate). In a conventional FET, the source/drain terminals and the gate terminal are separated by a spacer of a certain minimum length LS, in order to sufficiently electrically separate the gate from the source/drain, that appears twice in the CPP of a conventional FET device. This separation may be reduced or even omitted according to the presently disclosed FET device.

According to an embodiment of the presently disclosed device, the first side of each channel layer may be arranged in abutment with the topside or the underside of a pair of source and drain prongs (i.e. the topside of a pair of source and drain prongs or the underside of a pair of source and drain prongs). The second side of the channel layer faces a gate prong. According to embodiments, said gate prong and said source prong of said pair of source and drain prongs may be arranged to overlap with a first common region of said each channel layer such that the first common region is located vertically between said source prong and said gate prong. Correspondingly, said gate prong and said drain prong of said pair of source and drain prongs may be arranged to overlap with a second common region of said channel layer, such that that the second common region is located vertically between said drain prong and said gate prong.

By the gate prongs and source/drain prongs overlapping a first/second common region of each channel layer, the gate body may be configured to, when the field-effect transistor is switched to an active state, induce, in each channel layer, an electrostatic doping in the first and second common regions and a channel region extending therebetween. The first and second common regions may have a respective first doping level when the FET device is inactive, and a respective electrostatically increased second doping level when the FET device is active. Thereby, the doping concentration in the first and second common regions of each channel layer may be effectively increased. A further function of the spacer in a conventional FET is to limit the amount of dopant diffusion into the channel region. The "dynamic doping" enabled by the presently disclosed FET device allows reducing chemical source and drain doping concentration (the channel layers may even be formed as uniformly doped channel layers, e.g. un-doped/intrinsically doped channel layers), further reducing the need for a spacer. In other words, a lower (chemical) doping level of the first and second common regions of each channel layer may hence be used than for the (typically highly chemically doped) source and drain regions of the conventional FET. This may, in turn, reduce the degradation of the sub-threshold-swing (SS) as the gate length scales down. Moreover, a channel region may be induced to extend completely between the first and second common regions, thereby enabling a reduced short-channel effect (SCE) when down-scaling.

As used herein, the term "horizontal" indicates an orientation or a direction in a horizontal plane, i.e. parallel to (a main plane of extension) of the substrate. The "first", "second" and "third" directions accordingly refer to respective horizontal directions. The "first direction" may also define a channel direction of the device and may accordingly be referred to as such. The "second/third directions" represent mutually opposite directions transverse to the first direction/channel direction. The term "vertical" means an orientation or a direction which is transverse to a horizontal plane, i.e. normal to (main plane of extension of) the substrate.

As used herein, the terms "first/second lateral side of the set of channel layers" indicate regions on horizontally opposite sides of the set of channel layers. In other words, the common source and drain body portions may be arranged at a first side of a vertical geometrical plane and the common gate body portion may be arranged at a second side of the vertical geometrical plane opposite the first side, the vertical geometrical plane extending through the channel layers in the first horizontal/channel direction.

As used herein, the term "source/drain prong" refers to a portion (e.g. layer-shaped) of the source/drain body protruding from the common source/drain body portion to a respective free end. The term "gate prong" correspondingly refers to a portion (e.g. layer-shaped) of the gate body protruding from the common gate body portion to a respective free end.

When reference is made to a pair of a source prong and a drain prong (or shorter, a pair of source and drain prongs), reference is made to a source prong and a drain prong arranged in abutment with a same channel layer. The pair of source and drain prongs may, in particular, refer to source and drain prongs arranged at a same level over the substrate.

The channel layers may form nanosheets. The channel layers may be formed by thin-film layers. Each channel layer may be formed by a 2D material such as a transition metal dichalcogenide ($MX_2$) or IGZO. However, channel layers of semiconductor materials such as semiconductors of group IV (e.g. Si-comprising such as Si or SiGe, or Ge) or group III-V (e.g. InP, InAs, GaAs, GaN) are also possible.

The source and drain prongs may each comprise semiconductor material and the common source and drain body portions may each comprise semiconductor material and/or metal. The source body and drain body may each be a semiconductor body. Alternatively, the source body may comprise a metal common source body portion and semiconductor source prongs, and the drain body may comprise a metal common drain body portion and semiconductor drain prongs. Alternatively, the source body and the drain body may each be a metal body. In any case, the common source and drain body portions may interconnect/merge the source and drain layer prongs, respectively.

According to embodiments also the common gate body portion may extend (horizontally) along the first and second common regions of each channel layer. Each channel layer and source and drain prong may accordingly be surrounded by the gate body on at least two sides thereof, i.e. horizontally and vertically. According to embodiments comprising a pair of channel layers arranged in a space between a pair of gate prongs (as set out below), this may apply to a sub-portion of the common gate body portion connecting/bridging the pair of gate prongs. Each pair of channel layers and associated pair of source and drain prongs may accordingly be surrounded by the gate body on three sides, e.g. in a tri-gate fashion.

The FET device may further comprise a set of vertically spaced apart insulating spacer layers, each spacer layer arranged level with and between a respective one of the aforementioned pairs of source and drain prongs. The spacer layers may provide structural support for the channel layers. The spacer layers may further serve to passivate surface portions of the channel layers located between the source and drain prongs. The spacer layers may additionally facilitate fabrication in that the channel layers may be stacked with the spacer layers. According to embodiments comprising a pair of channel layers arranged in abutment with a same pair of source and drain prongs, as set out above, a spacer layer may be arranged between the pair of channel layers.

According to embodiments, the set of channel layers may comprise a pair of channel layers (e.g. at least one pair) arranged in abutment with a same pair of source and drain prongs from mutually opposite sides thereof, such that the pair of prongs are sandwiched between the pair of channel layers. In other words, an upper channel layer of the pair may be arranged in abutment with a topside of the source and drain prongs and a lower channel layer of the pair may be arranged in abutment with an underside of the source and drain prongs. This may allow an increased drive current, since a same pair of source and drain prongs may be connected by a pair of channel layers.

The pair of channel layers may be arranged in, i.e. extend through, a (vertical) space between a pair of gate prongs. Accordingly, the second side of the upper channel layer (defining a topside of the upper channel layer) of the pair of channel layers may face an upper gate prong of the pair of gate prongs and the first side of the upper channel layer (defining an underside of the upper channel layer) may abut the respective topside of the source and drain prongs. Meanwhile, the second side of the lower channel layer (defining an underside of the lower channel layer) of the pair of channel layers may face a lower gate prong of the pair of gate prongs and the first side of the lower channel layer (defining a topside of the lower channel layer) may abut the respective underside of the source and drain prongs. This may allow an improved channel control in that the pair of gate prongs effectively may form a tri-gate configuration with respect to the pair of channel layers and the pair of source and drain prongs.

According to embodiments, the set of channel layers may comprise at least one further channel layer arranged in abutment with a topside or underside of a further pair of source and drain prongs, and wherein a gate prong of the pair of gate prongs is arranged between said further channel layer and one channel layer of said pair of channel layers. One of the gate prongs of the pair may accordingly act as gate with respect to channel layers connected to two different pairs of source and drain prongs.

According to embodiments, a horizontal separation, along the second direction, between the common gate body portion and the common source and drain body portions may exceed a (horizontal) length of the gate prongs and source/drain layer prongs. Electrical separation between the gate prongs and common source and drain body portions, on the one hand, and on the other hand between the source and drain layer prongs and the common gate body portion may thus be ensured.

According to embodiments, the FET device may further comprise first dielectric layer portions arranged alternatingly with the source prongs and second dielectric layer portions arranged alternatingly with the drain prongs, such that each gate prong is arranged between a first and second dielectric layer portion. Each gate prong may hence be arranged level with and between a pair of first and second dielectric layer portions while being offset (vertically) from the source and layer drain layer prongs.

According to embodiments, a distal end of each gate prong may be separated from (a respective sidewall surface of) the common source and drain body portions by an insulating layer. A risk of shorting between the gate and source/drain bodies may hence be reduced.

According to embodiments, an arrangement of a first and a second FET device is provided, each FET device having a design according to the above described FET device. The first and second FET device may be arranged beside each other (e.g. on the substrate). The gate body of the first FET device and the gate body of the second FET may share a common gate body portion arranged intermediate the respective sets of channel layers of the first FET and the second FET. The gate prongs of the first FET and second FET may protrude from the shared common gate body portion in opposite directions.

This enables two FET devices to be combined in an area efficient manner with a shared-gate configuration. This configuration may be useful for combining FET devices of complementary channel types, i.e. for forming CMOS-devices. Accordingly, the first FET device may be an n-type FET and the second FET device may be a p-type FET.

BRIEF DESCRIPTION OF THE DRAWINGS

The above, as well as additional objects, features and benefits of the present disclosure, will be better understood through the following illustrative and non-limiting detailed description, with reference to the appended drawings. In the drawings like reference numerals will be used for like elements unless stated otherwise.

FIGS. 4a, 4b through 20a and 20b depict steps of an example method for forming a FET device.

FIGS. 4a and 4b show cross sections of a layer stack 1000 along respective vertical planes C-C' and A-A'. The layer stack 1000 can be formed on a substrate 1102. The substrate 1102 may be a substrate in accordance with any of the examples provided in connection with substrate 102 of FIG. 1. The layer stack 1000 comprises an alternating sequence of sacrificial layers 1002, 1006 and channel layers 1004, wherein the sacrificial layers 1002, 1006 are alternatingly first sacrificial layers 1002 and second sacrificial layers 1006. The second sacrificial layers 1006 may also be denoted "second non-channel layers".

FIG. 16a includes the individual designations 1120s and 1120d while subsequent figures for illustrational clarity include only the common designation 1120. Each source/drain body 1120 may comprise a common semiconductor source/drain body portion 1122 arranged at the first side 1010a of the fin structure 1010, and a set of vertically spaced apart semiconductor source/drain layer portions or prongs 1124 protruding from the common source body portion 1122 in the Y direction.

FIGS. 20a and 20b show source/drain contacts 1054 have been formed on the source/drain bodies 1120. The contacts 1054 may as shown be formed as wrap-around contacts, i.e. wrapping around the common body portions 1122.

DETAILED DESCRIPTION OF THE PRESENT DISCLOSURE

Figure 1:
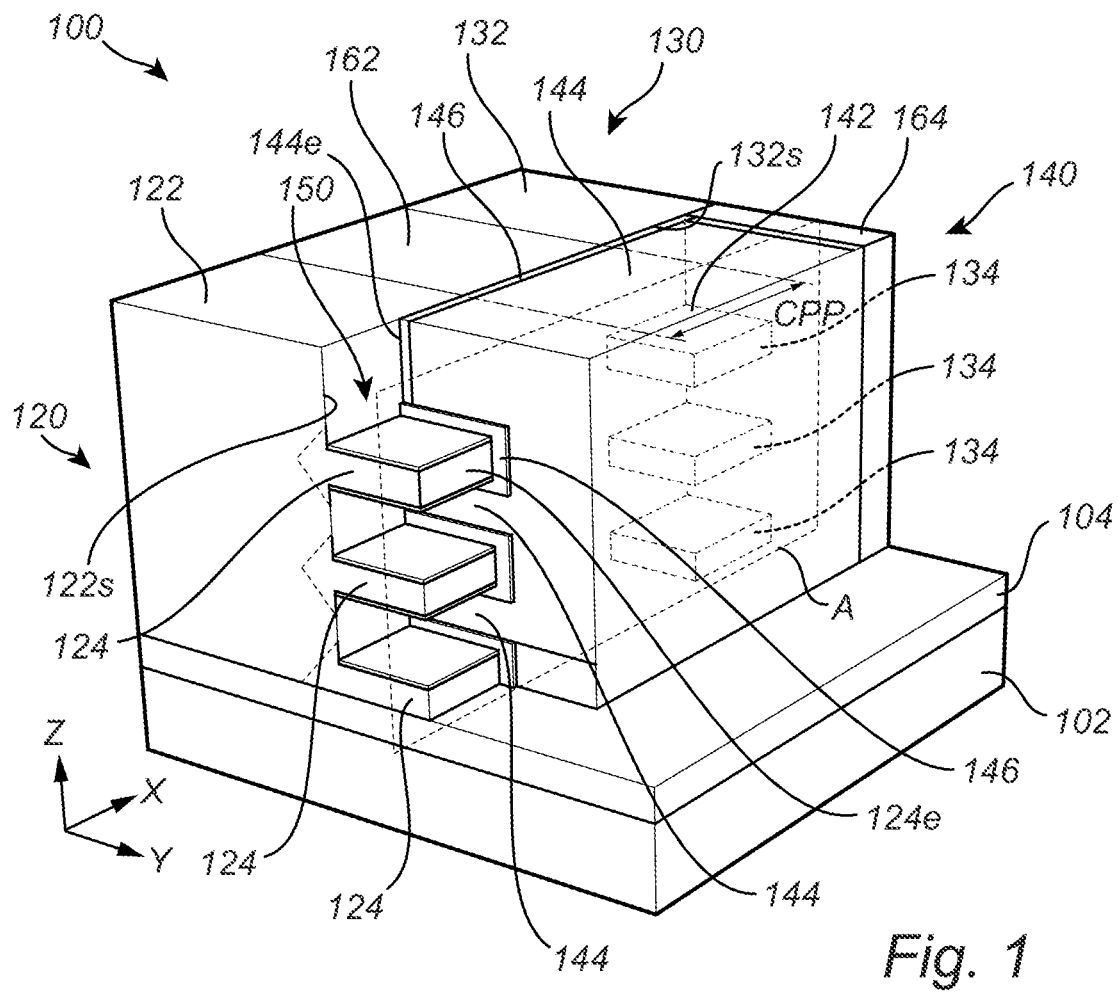
FIG. 1 is a perspective view of a FET device according to an embodiment.

FIG. 1 shows in a schematic perspective view a representative FET device 100 according to an embodiment. The FET device 100 comprises a substrate 102, a source body 120, a drain body 130, and a set of vertically spaced apart semiconductor channel layers, e.g. in the shape of nanosheets, commonly referenced 150. The channel layers 150 are stacked above each other. The channel layers 150 extend between the source body 120 and the drain body 130 in a first horizontal direction (denoted X in the figures) along the substrate 102. The first horizontal direction X corresponds to a channel direction of the FET device 100, for instance, a direction along which current flows between the source and drain bodies 120, 130 when the FET device 100 is in an active state.

The substrate 102 may be a semiconductor substrate, i.e. a substrate comprising at least one semiconductor layer, e.g. of Si, SiGe or Ge. The substrate 102 may be a single-layered semiconductor substrate, for instance formed by a bulk substrate. A multi-layered/composite substrate 102 is also possible, an epitaxially grown semiconductor layer on a bulk substrate, or a semiconductor-on-insulator (SOI) substrate. The substrate 102 of FIG. 1 is covered by an insulating layer 104 (e.g. silicon oxide or other conventional inter-layer dielectric material) which, however, may be omitted if the top surface of substrate 102 already is insulating.

The source body 120 comprises a common source body portion 122 and a set of vertically spaced apart source prongs 124 (vertical direction denoted Z in the figures) protruding from the common source body portion 122 in a second horizontal direction (denoted Y in the figures) transverse to the first horizontal direction X. The drain body 130 comprises a common drain body portion 132 and a set of vertically spaced apart drain layer prongs 134 protruding from the common drain body portion 132 in the second horizontal direction Y. The gate body 140 comprises a common gate body portion 142 and a set of vertically spaced apart gate prongs 144. Each gate prong 144 protrudes from the common gate body portion 142 in a third horizontal direction (opposite/negative Y) into a space above or underneath a respective one of the channel layers 150.

The common source body portion 122 and the common drain body portion 132 are both arranged at a first lateral side of the set of channel layers 150. The common gate body portion 142 is arranged at a second lateral side of the set of channel layers 150, opposite the first lateral side. FIG. 1 indicates a geometrical plane A. The plane A is a vertically oriented plane (i.e. parallel to the XZ-plane) and extends through the set of channel layers 150 along the first horizontal/channel direction X. The common source and drain body portions 122, 132 and the common gate body portion 142 are accordingly arranged at mutually opposite sides of the plane A, thereby establishing a lateral/horizontal offset between the common source and drain body portions 122, 132 and the common gate body portion 142.

Each channel layer 150 is arranged in abutment with and extends in the X direction between a respective pair of a source prong 124 and a drain prong 134, e.g. the source and drain prong 124, 134 being arranged at a same vertical level over the substrate 102. Each channel layer 150 comprises a first side arranged in abutment with the respective pair of source and drain prongs 124, 134, and a second side opposite the first side and facing a respective gate prong 144. More specifically, each channel layer 150 may as shown either be arranged with the first side (e.g. an underside of the channel layer) in abutment with a respective topside of a pair of source and drain prongs 124, 134, or with the first side (e.g. a topside of the channel layer) in abutment with a respective underside of a pair of source and drain prongs 124, 134. As may be appreciated from FIG. 1, a topside of a source or drain prong 124, 134, or a channel layer 150 may refer to a side of a prong/channel layer facing away from the substrate 102 while an underside may refer to a side of a prong/channel layer facing the substrate 102.

The source and drain bodies 120, 130 may be semiconductor bodies, e.g. comprising semiconductor common body portions 122, 132 and semiconductor source/drain prongs 124, 134. Epitaxially grown group IV (e.g. Si, Ge, SiGe) and group III-V (e.g. InP, InAs, GaAs, GaN) semiconductors are a few possible examples. The source and drain bodies 120, 130 may alternatively be metal bodies wherein the common source and drain body portions 122, 132 may be formed of metal and the source and drain prongs 124, 134 may be formed of metal. Example metals include W, Al, Ru, Mo or Co. The source and drain bodies 120, 130 may in this case additionally comprise a barrier metal layer, e.g. Ta, TiN or TaN, enclosing a bulk material of the respective bodies 120, 130 (such as any of the afore-mentioned metals). The source and drain bodies 120, 130 may also be combined metal and semiconductor bodies, e.g. comprising metal and semiconductor common body portions 122, 132 and semiconductor source and drain prongs 124, 134 (e.g. epitaxially grown). Such a configuration is depicted in FIG. 1 wherein the common source body portion 122 is shown to abut and enclose faceted (dashed lines) ends of the semiconductor source prongs 124. The shape of the facets is merely exemplary and will generally depend on the lattice structure of the semiconductor material and growth conditions of the epitaxy. As may be appreciated, semiconductor source and drain bodies 120, 130 may be obtained by continuing the growth such that the growth fronts of the source prongs 124 and drain prongs 134, respectively, merge to form the common source and drain body portions 122, 132. The source and drain prongs 124, 134 (and the common source and drain bodies 122, 132 if made of semiconductor material) may each be doped (e.g. in-situ during epitaxy) with a dopant appropriate for the intended type of the device (e.g. n-type FET or p-type FET).

The thickness of the source and drain prongs 124, 134 may for example be in the range of 2 nm to 5 nm. As may be appreciated, thinner prongs may enable stacking of more channel layers 150, which may be beneficial as the total height of the full device stack typically is constrained. Conversely, thicker prongs may reduce resistance which means that the thickness of the prongs tend to be a trade-off.

The channel layers 150 may be formed as thin-film layers. Each channel layer may be formed by a 2D material such as a transition metal dichalcogenide ($MX_2$) or IGZO. However, channel layers of semiconductor materials such as semiconductors of group IV (e.g. Si, Ge, SiGe) or group III-V (e.g. InP, InAs, GaAs, GaN) are also possible.

The gate body 140 may be a metal body. The common gate body 142 and the gate prongs 144 may be formed of metal. Example metals include one or more gate work function metal (WFM) layers and/or a gate electrode fill layer. Examples of gate WFM material include conventional n-type and p-type effect WFM metals, such as TiN, TaN, TiAl, TiAlC or WCN, or combinations thereof. Examples of gate fill material gate include W and Al. A gate dielectric layer 146 is provided, separating the gate body 140 from the channel layers 150 and the source and drain layer prongs 124, 134. The gate dielectric layer 146 may be a conventional gate dielectric of a high-k, such as $HfO_2$, LaO, AlO and ZrO.

Figure 2:
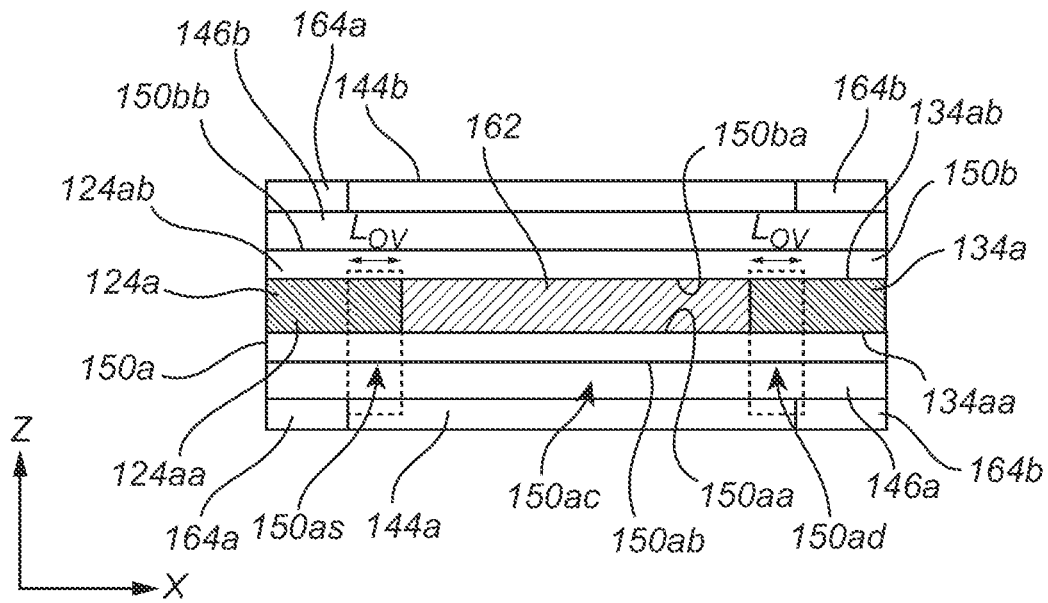
FIG. 2 is a cross-sectional view of the FET device of FIG. 1.

FIG. 2 is a cross-sectional view of the device 100, showing a portion of a section taken along plane A and comprising a pair of source and drain prongs 124a, 134a and a pair of channel layers 150a, 150b. The pair of channel layers 150a, 150b are arranged in abutment/direct contact with the pair of source and drain prongs 124a, 134a from mutually opposite sides, such that the pair of prongs 124a, 134a are sandwiched between the pair of channel layers 150a, 150b. The pair of source and drain prongs 124a, 134a and the pair of channel layers 150a, 150b are in turn arranged in a space between a pair of gate prongs 144a, 144b.

The channel layer 150a (representing a lower channel layer of the pair) comprises a first side 150aa (e.g. forming a topside of the channel layer 150a) arranged in abutment with an underside 124aa of the source prong 124a and an underside 134aa of the drain prong 134a. The channel layer 150a comprises a second side 150ab (e.g. forming an underside of the channel layer 150a), oppositely oriented with respect to the first side 150aa, and facing a gate prong 144a. The gate prong 144a extends along the second side 150ab, i.e. in the X direction. The gate dielectric layer 146a is sandwiched between the gate prong 144a and the channel layer 150a. Correspondingly, the channel layer 150b comprises a first side 150ba (e.g. forming an underside of the channel layer 150b), arranged in abutment with a topside 124ab of the source prong 124a and a topside 134ab of the drain prong 134a. The channel layer 150b comprises a second side 150bb (e.g. forming a topside of the channel layer 150b), oppositely oriented with respect to the first side 150ba, and facing a gate prong 144b. The gate prong 144b extends along the second side 150bb, i.e. in the X direction. The gate dielectric layer 146b is sandwiched between the gate prong 144b and the channel layer 150b.

As indicated by the dashed line boxes in FIG. 2, the gate prong 144a and the source prong 124a may be arranged to overlap with a first common region 150as of the channel layer 150a such that the first common region 150as is located vertically between the source prong 124a and the gate prong 144a. Moreover, the gate prong 144a and the drain prong 134a may as shown be arranged to overlap with a second common region 150ad of the channel layer 150a, such that that the second common region 150ad may be located vertically between the drain prong 134a and the gate prong 144a. Lov (also shown in FIG. 1) indicates the length of the common overlap regions 150as, 150ad, as seen along the X direction. The common overlap regions 150as, 150ad allow dynamic doping of the channel layers 150a, 150b during operation of the device 100, as will be further described below. A corresponding configuration applies to the channel layer 150b wherein the gate prong 144b and the source prong 124a (drain prong 134a) are arranged to overlap with a first (second) common region of the channel layer 150b such that the first (second) common region is located vertically between the source prong 124a (drain prong 134a) and the gate prong 144a. Accordingly, also the channel layer 150b may like the channel layer 150a be dynamically doped.

In FIG. 2, the overlap length Lov may be the same on the source and the drain side, and also for the channel layers 150a and 150b, but it is contemplated that the lengths Lov of the common overlap regions may be different from each other, e.g. due to process variations etc.

The overlap length Lov may for example be in the range from 1 nm (or less) to 4 nm (or greater). However, a zero overlap length (Lov=0) is also envisaged. Such a configuration may be used, e.g. in case dynamic doping is not desired or necessary, or in case a sufficiently strong dynamic doping is induced already by a fringing electrical field of the gate body. Regardless of the particular value of the overlap length Lov, the design of the device 100 allows a reduced CPP (indicated in FIG. 1) compared to conventional finFET and nanosheet-based devices. The CPP of the device 100 may by way of example be in the range of 20 to 50 nm.

Further shown in FIG. 2, a spacer layer 162 may be arranged level with and between the pair of source and drain prongs 124a, 134a. The spacer layer 162 may be formed as an insulating layer such that the channel layers 150a, 150b may be electrically insulated from each other along the length of their respective channel regions 150ac, 150bc.

As indicated in FIG. 1, the configuration shown in FIG. 2 may be applicable to one or more further pair of source and drain prongs. For example, in FIG. 1 the top as well as middle pair of source and drain prongs 124, 134 are arranged in abutment with a respective pair of channel layers 150, and arranged between a respective pair of gate prongs 144. The number of pairs of source and drain prongs 124, 134, channel layers 150, and gate prongs 144 may both be smaller and greater than shown in FIG. 1. As exemplified by the bottom pair of source and drain prongs 124, 134, it is also possible to arrange only a single channel layer 150 in abutment with a pair of source and drain prongs 124, 134, and a gate prong 144 may be provided on only a single side of the channel layer 150 and source and drain prongs 124, 134. According to alternative embodiments, each pair of source and drain prongs 124, 134 may be arranged in abutment with a pair of channel layers, and/or each pair of source and drain prongs 124, may be arranged in a space between a respective pair of gate prongs 144 (implying the number of gate prongs being one greater than the number of pairs of source and drain prongs). According to further alternative embodiments, only a single channel layer 150 may be arranged in abutment with each pair of source and drain prongs 124, 134a (e.g. a topside 124ab or underside 124aa thereof). More generally, the source and drain bodies may comprise at least two pairs of source and drain prongs, respectively, the gate body may comprise at least three gate prongs, and the set of channel layers may comprise one or two channel layers extending between each of the at least two pairs of source and drain prongs.

With reference to FIG. 1 again, the common gate body portion 142 may be co-extensive with the gate prongs 144 along the X direction. Accordingly, also the common gate body portion 142 may extend horizontally along the first and second common regions of each channel layer 150 (e.g. 150as, 150ad). For a pair of source and drain prongs such as 124a, 134a shown in FIG. 2, the pair of gate prongs 144a, 144b may together with the sub-portion of the common gate body portion bridging/connecting the pair of gate prongs 144a, 144b form a tri-gate with respect to the pair of channel layers 150a, 150b and source and drain prongs 124a, 134a, i.e. surrounding on three sides (above, below and laterally). However, a coextensive gate body portion 142 and gate prongs 144 is not a requirement on the device 100, among others since a common overlap of a channel layer 150 by the source and drain prong 124, 134 and the gate prong 144 is sufficient to allow dynamic doping.

As further shown in FIG. 1, a distal end 144e of each gate prong 144 may be separated from a respective side surface/sidewall surface 122s, 132s of the common source and drain body portions 122, 132 by at least the thickness of the gate dielectric layer 146. Further separation may be provided by a further (not shown) dielectric spacer. The thickness (along the Y direction) of the dielectric material may by way of example be about 5 nm or greater. Meanwhile, a distal end 124e of each source prong 124 (and correspondingly the distal end of each drain prong 134) may be separated from a respective sidewall surface of the common gate body portion 142 by at least the gate dielectric 146 and possibly a further dielectric spacer. To accommodate for the respective dielectric separation, a horizontal separation, along the Y direction, between the common gate body portion 142 and the common source and drain body portions 122, 132 may exceed a respective length of the gate prongs 144 and source/drain layer prongs 124, 134.

FIG. 1 additionally shows an insulating layer 162 or "insulating wall" separating the source body 120 from the drain body 130 along the X direction.

FIG. 1 additionally shows an insulating layer 164 delimiting a length dimension of the gate body 140 along the X direction. The insulating layer 164 may separate the gate body 140 from the gate body of a further FET device provided after and aligned with the device 100, as viewed along the first horizontal direction X. A corresponding insulating layer may be provided at the source side. Accordingly, first and second dielectric layer portions (formed by the layer 164) may be arranged in the spaces between the source and drain layer prongs 124, 134 such that each gate prong 144 is arranged intermediate a respective pair of first and second dielectric layer portions (see portions 164a, b in FIG. 2). The insulating layers 162 and 164 may each be formed of an oxide or nitride, such as $SiO_2$, SiN, SiCBN, SiCON or SiCO.

As mentioned above, the common overlap regions (e.g. 150as, 150ad shown in FIG. 2) allow dynamic doping of the channel layers 150 during operation of the device 100. Accordingly, the gate body 140 may, when the field-effect transistor 110 is switched to an active state, induce, in each channel layer 150, an electrostatic doping in the first and second common regions (e.g. regions 150as, 150ad). Additionally, the gate body 140 may induce a channel region 150ac extending between and thus connecting the first and second common regions of each channel layer 150.

The charge carriers added to the common regions may be electrons or holes, depending on the voltage applied. When increasing the carrier concentration when the carrier is holes, a negative voltage may be applied, which lowers the electron concentration and thereby increases the hole concentration.

The first and second common regions of each channel layer 150 may thus present a respective first doping level when the device 100 is inactive (e.g. switched off), and a respective electrostatically increased second doping level when the device 100 is active (e.g. switched on). A lower charge carrier concentration when the device 100 is inactive enables reduced SCE as off-current leakage tend to increase with doping level. On the other hand, an increased charge carrier concentration when the device 100 is active enables increased drive current of the device 100 when active.

Because the second doping level may be electrostatically increased by the gate voltage, the doping level of the first and second common regions of the channel layers 150 are dynamically controlled in conjunction with the on-/off control of the device 100 by the gate 140.

The channel layers 150 may be formed with a uniform doping level. Doping diffusion which may result during chemical doping may hence be mitigated. However, the channel layers 150 abutting the source and drain prongs 124, 134 may also be chemically doped to enable even greater source/drain doping concentrations in the active state and reduced contact resistance (e.g. with respect to the common source/drain body portions 122, 132).

Referring to doping level of the common regions of each channel layer when no voltages are applied to the channel layers 150 (such as the doping level of the channel layers when the device 100 is not used) as the "un-gated" doping level, the device 100 allows inducing a first doping level in the common regions of each channel layer 150 less than the un-gated doping level. That is, when the transistor is inactive, the gate bias may electrostatically deplete the first and second common regions. This may further lower the doping level of the first and second common regions when the transistor is inactive, which further mitigates SCE such as a poor SS.

As an example, an intrinsic doping level of the channel layers 150 may be $10^{10}$ cm$^{-3}$ to $10^{19}$ cm$^{-3}$, while a chemical (i.e. non-electrostatic) doping may e.g. be in the magnitude of $10^{20}$ cm$^{-3}$.

The thickness (i.e. as seen along the vertical Z direction) of the channel layers 150 may, depending e.g. on the material selection, be about 10 nm or less. For example, a thickness in the range from 3 to 7 nm may be used for Si-, SiGe- or Ge-channel layers 150, while 1 nm or less may be appropriate for thin-film layers. If the thickness of the channel layers 150 is sufficiently low, the gate 140 may induce a channel though the entire thickness of the channel layers 150.

If there is no predetermined chemical doping of the channel layers 150, then depending on the voltage applied by the gate 140, different charge carriers (electrons or holes) may be electrostatically doped in the first and second common regions of the channel layers 150. Thereby, the same device 100 may act as an NMOS or PMOS depending on the control of the gate 140.

Figure 3:
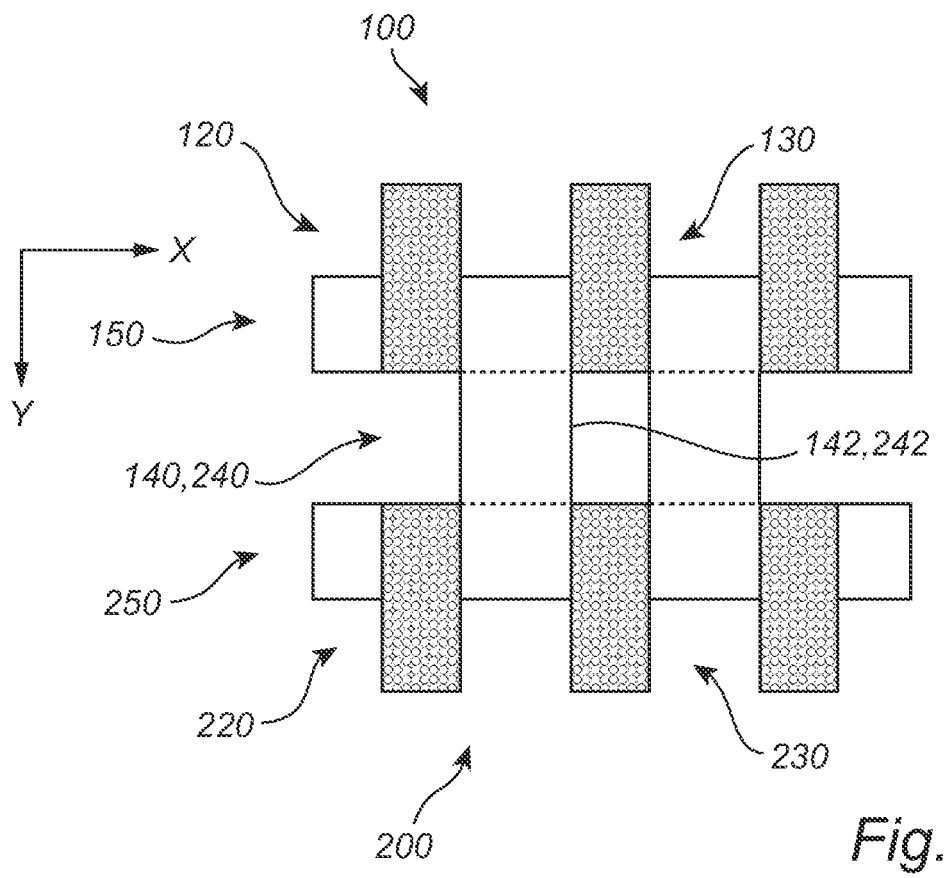
FIG. 3 is a top-down view of the FET device of FIG. 1, adjacent a second FET device.

FIG. 3 is a schematic top-down view of an arrangement of FET devices according to a further embodiment comprising a first FET device 100 and a second FET device 200, each having a design according to the above described FET device 100. In FIG. 3, elements of device 200 are numbered 2NN, respectively, wherein the last two digits NN corresponds to an element 1NN of the device 100 as shown in FIGS. 1 and 2. To avoid undue repetition, a description of like elements will not be repeated. Directions X and Y in FIG. 3 correspond to horizontal directions, parallel to a (not shown) supporting substrate. The first and second device 100, 200 each comprise a respective source body 120, 220, a respective drain body 130, 230, a respective gate body 140, 240, and a respective set of channel layers 150, 250.

The first and second device 100, 200 are arranged beside each other (e.g. on a substrate like substrate 102) in a parallel fashion, i.e. such that the channel directions of the devices 100, 200 extend in parallel, (i.e. along the X direction).

The gate bodies 140, 240 share a common gate body portion (for consistency indicated by a double designation 142, 242) arranged intermediate the sets of channel layers 150, 250. The gate prongs 144, 244 thus protrude from the shared common gate body portion 142, 242 in opposite lateral directions (along the Y and −Y direction respectively). Correspondingly, the source and drain prongs of the source and drain bodies 120, 130 and the source and drain prongs of the source and drain bodies 220, 230 protrude in opposite horizontal directions from the respective common body portions 122/132, 222/232 (prongs of bodies 120/130 along the +Y direction and prongs of bodies 220/230 along the −Y direction).

The arrangement may be comprised in a CMOS device wherein the first FET device 100 may be configured to operate as an n-type FET and the second FET device may be configured to operate as a p-type FET 200. The devices 100, 200 may e.g. form part of a same circuit cell (e.g. a functional cell, a logic cell) of an integrated circuit.

The arrangement/circuit cell may, as indicated in FIG. 3, comprise a number of further corresponding FET devices arranged along a same respective set of channel layers 150, 250, representing respective "tracks". Each of these further devices may comprise respective source, drain and gate bodies with a configuration like those of device 100, 200.

The FET device 100 disclosed above may be fabricated using a combination of semiconductor device processing techniques typical for CMOS FET device fabrication, e.g. including but not limited to epitaxy, patterning (e.g. litho-etch or multiple patterning techniques such as spacer-assisted techniques), spacer formation, metal deposition, doping, etc. Example process techniques for forming a FET device, e.g. the FET device 100, will now be described with reference to FIGS. 4a and 4b through 20a and 20b.

FIGS. 4a, 4b through 14a and 14b depict method steps for forming a fin structure which may be used as a precursor for the subsequent method steps for completing the FET device, as depicted in FIGS. 15a, 15b through 20a and 20b.

Reference will in the following be made to a first fin part 1010s, a second fin part 1010d and a third fin part 1010c of a fin structure 1010, intermediate the first and second fin parts 1010s, 1010d (e.g. FIG. 10a). The first fin part 1010s corresponds to a part of the fin structure 1010 located in a source region of the FET device to be formed. The second fin part 1010d corresponds to a part of the fin structure 1010 located in a drain region of the FET device to be formed. The third fin part 1010c corresponds to a part of the fin structure 1010 located in a gate region of the FET device to be formed.

The following description will mainly refer to processing steps applied to one set of such first, second and third fin parts 1010s, 1010d, 1010c, to enable forming of one FET device along a fin structure 1010. However, corresponding processing steps may be applied to a number of such sets of fin parts along the fin structure 1010 to allow forming of a number of corresponding FET devices along a same fin structure 1010.

As will be described in further detail, the method comprises etching each of the first and the second fin part 1010s, 1010d of the fin structure 1010 laterally from a first side 1010a such that a set of source cavities and a set of drain cavities 1048 are formed in the first fin part 1010s and the second fin part 1010d, respectively (e.g. FIGS. 15a, 15b). Subsequently, a source body 1120s and a drain body 1120d are formed, each comprising a respective common body portion 1122 along the first side 1010a and a set of prongs 1124 protruding from the respective common body portion into the source and drain cavities 1048, respectively (e.g. FIGS. 16a, 16b). The method further comprises etching the third fin part 1010c laterally from the second side 1010b such that a set of gate cavities 1060 is formed in the third fin part 1010c (e.g. FIGS. 18a, 18b). Subsequently, a gate body 1140 is formed comprising a common gate body portion 1142 along the second side and a set of gate prongs 1144 protruding from the common gate body portion into the gate cavities 1060 (e.g. FIGS. 19a, 19b).

Figure 4A:
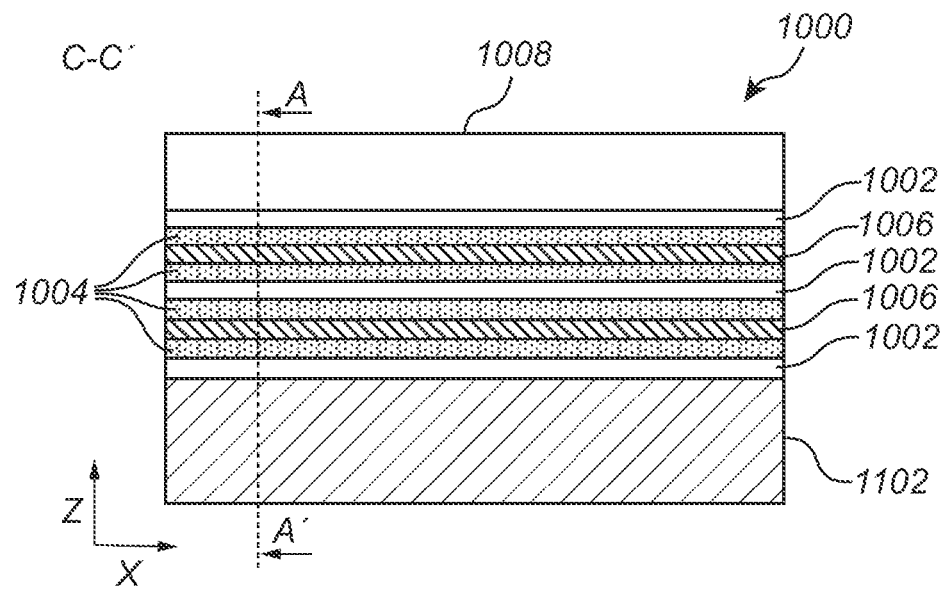
Figure 4B:
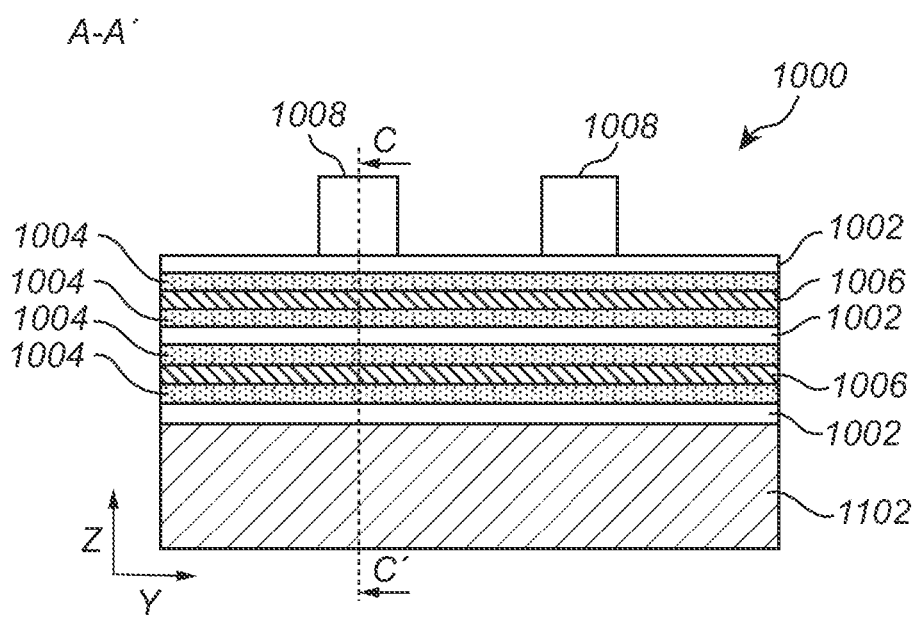

FIGS. 4a and 4b depict cross sections of a layer stack 1000 along respective vertical planes C-C' and A-A'. The layer stack 1000 can be formed on a substrate 1102. The substrate 1102 may be a substrate in accordance with any of the examples provided in connection with substrate 102 of FIG. 1. The layer stack 1000 comprises an alternating sequence of sacrificial layers 1002, 1006 and channel layers 1004, wherein the sacrificial layers 1002, 1006 are alternatingly first sacrificial layers 1002 and second sacrificial layers 1006. The second sacrificial layers 1006 may also be denoted "second non-channel layers".

Each layer 1002, 1004, 1006 may be formed as a layer of epitaxial (i.e. epitaxially grown/formed/deposited) semiconductor material. The layers 1002, 1004, 1006 may be grown on the substrate 1102 in an epitaxy process, such as physical vapor deposition (PVD) or chemical vapor deposition (CVD).

According to the illustrated example, each first sacrificial layer 1002 is formed of a first semiconductor material, each second sacrificial layer 1006 may be formed of a second semiconductor material, and each channel layer 1004 may be formed of a third semiconductor material. The first through third semiconductor materials hereby refers to different semiconductor materials, e.g. different epitaxial semiconductor materials. The first semiconductor material may also be denoted "sacrificial semiconductor material". The second semiconductor material may also be denoted "second layer material". The third semiconductor material may also be denoted "channel material".

The first through third semiconductor materials may be chosen to provide an etch contrast between the layers 1002, 1004, 1006. The materials may in particular be chosen to facilitate selective removal of the first sacrificial layers 1002 to the channel layers 1004 and the second sacrificial layers 1006, and subsequently selective removal of the second sacrificial layers 1006 to the channel layers 1004. The term "selective" in connection with "removal" or "etching" of a layer or a material is herein to be understood as a removal of the layer or the material by a selective etching process, wherein a removal rate/etch rate of the layer or the material to be selectively removed/etched exceeds a removal rate/etch rate of at least one other layer or material exposed to the etching process.

According to some examples, the channel layers 1004 may be formed of $SiGe_x$, the second sacrificial layers 1006 may be formed of $SiGe_y$, and the first sacrificial layers 1002 may be formed of $SiGe_z$, with $0 \leq x < y < z$. The compositions of the first and second sacrificial layers 1002, 1006 may more specifically be $y=x+d_1$ and $z=y+d_2$ with $d_1$, $d_2 \geq 0.25$. These relative proportions of Ge content may facilitate an efficient selective removal. According to some examples, the channel layers 1004 may be formed of Si (i.e. $SiGe_{x=0}$), the second sacrificial layers 1006 may be formed of $SiGe_{0.25}$ and the first sacrificial layers 1002 may be formed of $SiGe_{0.5}$. More generally, the layers 1002, 1004, 1006 may be formed of any combination of semiconductor materials compatible with the subsequent selective processing steps to be described. For example, the first and second sacrificial layers 1002, 1006 may be SiGe layers as set out above while the channel layers 1004 may be thin-film layers, e.g. formed by a 2D material such as a transition metal dichalcogenide ($MX_2$) or IGZO. Such a stack may be formed using, for instance, CVD or layer transfer techniques known in the art. According to a further example, the layers 1002, 1004, 1006 may be formed of different group III-V semiconductor material.

The number of layers of the depicted layer stack 1000 is merely an example and the number may be smaller or greater than depicted. As may be appreciated from the following, the number of layers of the layer stack 1000 may be selected in accordance with the number of layers, source/drain prongs and gate prongs desired in the finished FET device (c.f. e.g. channel layers 150, source/drain prongs 124/134 and gate prongs 144 of the device 100).

According to some examples, the layer stack 1000 may comprise, e.g. one or more units of (in the illustrated example one such unit), a consecutive sequence of a (lower) second sacrificial layer 1006, a (lower) channel layer 1004, a first sacrificial layer 1002, a(n) (upper) channel layer 1004 and a(n) (upper) second sacrificial layer 1006. This facilitates forming a FET device comprising a pair of gate prongs, and between the gate prongs, a pair of source and drain prongs and a pair of channel layers in abutment with the pair of source and drain prongs.

Figure 5A:
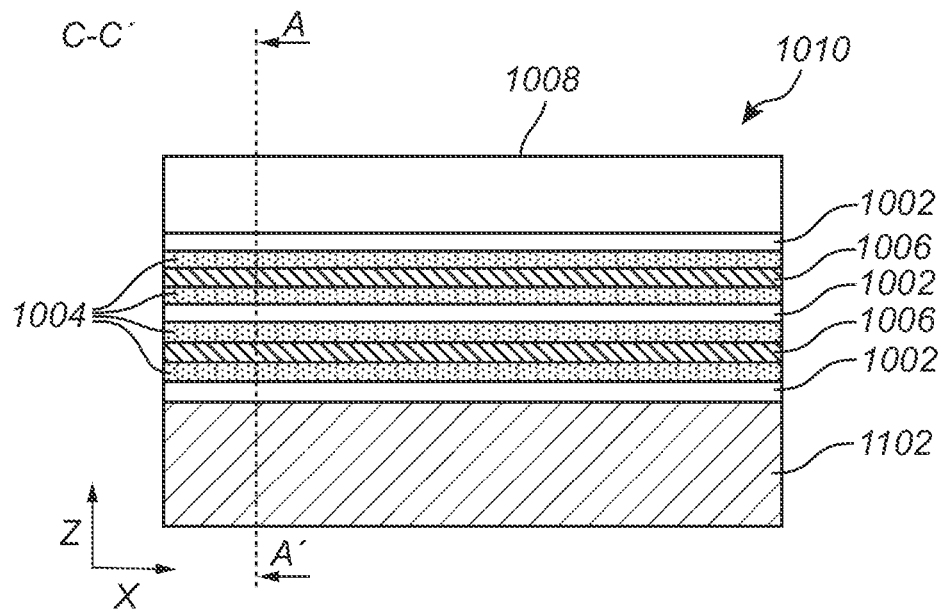
FIGS. 5a and 5b show the layer stack 1000 has been patterned to form a number of fin structures 1010. A longitudinal dimension, a width dimension, and a height dimension of each fin structure 1010 is respectively oriented along a first horizontal direction X, a second horizontal direction Y and a vertical direction Z, in relation to the substrate 1102. Each fin structure 1010 comprises a fin-shaped layer stack comprising an alternating sequence of layers corresponding to the alternating sequence of the layer stack 1000.
Figure 5B:
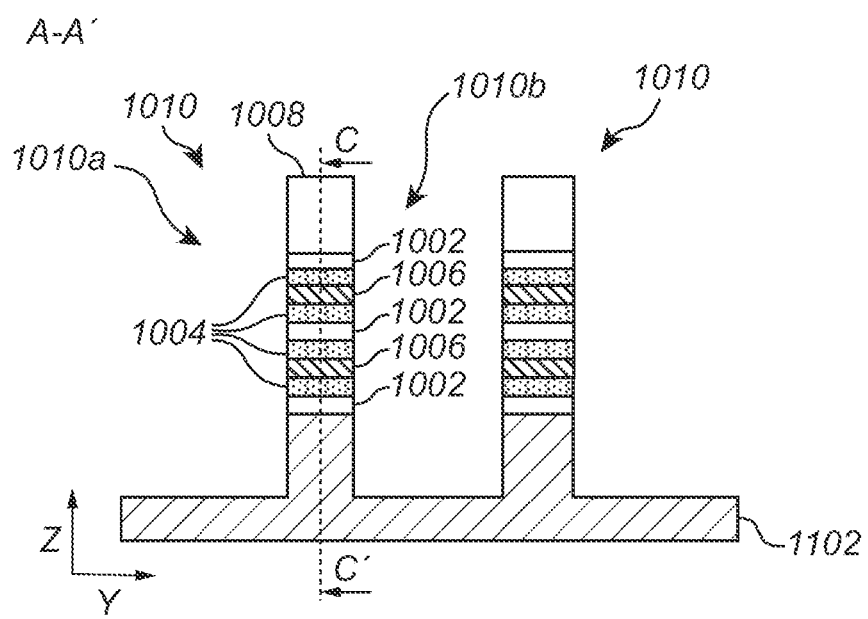

In FIGS. 5a and 5b, the layer stack 1000 has been patterned to form a number of fin structures 1010. A longitudinal dimension, a width dimension, and a height dimension of each fin structure 1010 is respectively oriented along a first horizontal direction X, a second horizontal direction Y and a vertical direction Z, in relation to the substrate 1102. Each fin structure 1010 comprises a fin-shaped layer stack comprising an alternating sequence of layers corresponding to the alternating sequence of the layer stack 1000. That is, each fin structure 1010 comprises an alternating sequence of sacrificial layers 1002, 1006 and channel layers 1004, wherein the sacrificial layers 1002, 1006 are alternatingly first sacrificial layers 1002 and second sacrificial layers 1006. The layers 1002, 1004, 1006 may be patterned to define corresponding nanosheets of each fin structure 1010, and may accordingly be referred to as sacrificial nanosheets 1002, 1006 and channel nanosheets 1004. Reference signs 1010a and 1010b denote respectively a first side of the fin structure 1010 and a laterally opposite second side of the fin structure 1010. Reference may in the following also be made to a first/second side surface of the fin structure, which term is to be understood as a (physical) surface of the first/second side 1010a/1010b of the fin structure 1010. For convenience, reference signs 1010a, 1010b may be used to refer to either the first/second sides or the first/second side surfaces of the fin structure 1010, in accordance with the context.

The layer stack 1000 may as shown be patterned by etching the layer stack 1000 while using a mask 1008 (which may be denoted "fin patterning mask 1008" and also is shown in FIGS. 4a and 4b) as an etch mask. Example etching processes for the fin patterning include anisotropic etching (top-down) like reactive ion etching (RIE). The etching of the layer stack 1000 may (as shown) extend into the substrate 1102. The substrate 1102 may thus be recessed adjacent the fin structures 1010 such that a base portion of each fin structure 1010 is formed in the substrate 1102. Recessing the substrate 1102 in this manner may accommodate for a thicker bottom isolation underneath the source, drain and gate bodies.

The mask 1008 may be formed by a mask material deposited on the layer stack 1000 and then patterned. Example mask materials include nitride materials such as SiN, or another conventional hard mask material suitable for fin patterning, e.g. $SiO_2$ or a-Si. Example patterning techniques for the mask 1008 include single-patterning techniques, e.g. lithography and etching, and multiple patterning techniques, e.g. self-aligned double or quadruple patterning (SADP or SAQP).

The figures depict the mask 1008 as comprising two mask portions, commonly referenced 1008, such that two fin structures 1010 may be formed. The two fin structures 1010 may, for example, be used to form a complementary pair of FET devices, e.g. an n-type FET and a p-type FET as depicted in FIG. 3. As may be appreciated, mask portions may, however, be formed in a number corresponding to the number of fin structures 1010 to be formed. In any case, a mask portion 1008 may remain on each fin structure 1010 as a capping during subsequent stages of the method.

Reference will in the following mainly be made to one fin structure 1010 however the following description applies correspondingly to any further fin structures.

Figure 6A:
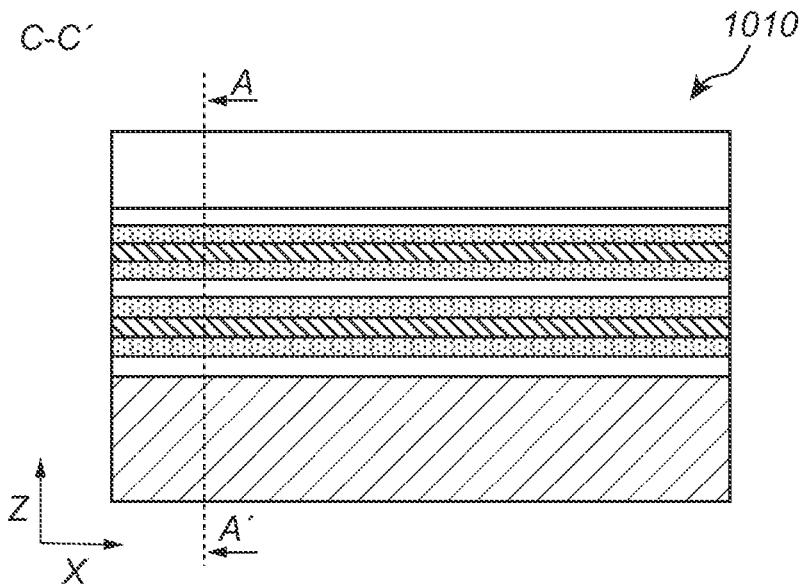
FIGS. 6a and 6b show a cover material deposited to form a liner 1012 along the first and second sides 1010a, 1010b of the fin structure 1010, in particular on the first and second side surfaces 1010a, 1010b of the fin structure 1010. A fill layer 1014 has further been formed, embedding the fin structure 1010.
Figure 6B:
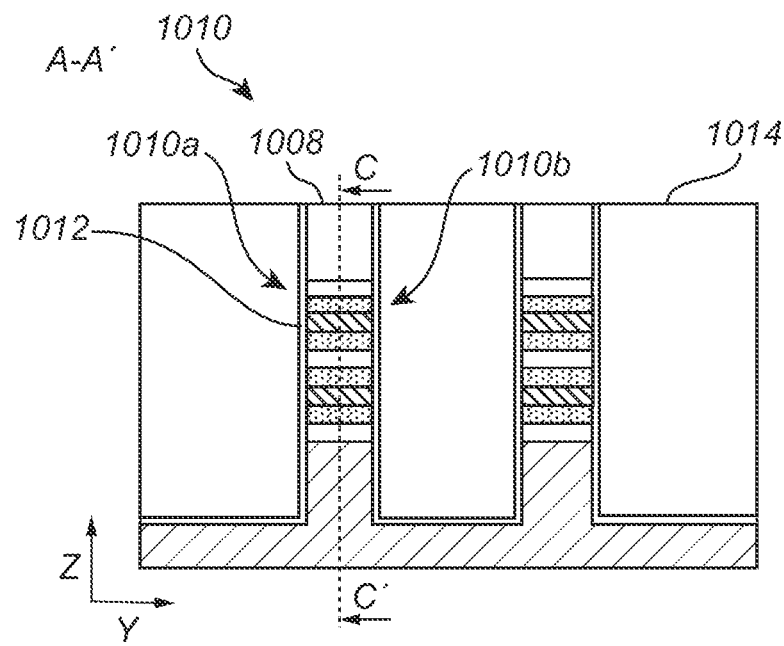

In FIGS. 6a and 6b, a cover material has been deposited to form a liner 1012 along the first and second sides 1010a, 1010b of the fin structure 1010, in particular on the first and second side surfaces 1010a, 1010b of the fin structure 1010. A fill layer 1014 has further been formed, embedding the fin structure 1010. The fill layer 1014 may also be denoted "process layer". The liner 1012 may be formed of a dielectric material, e.g. an oxide such as $SiO_2$, or a nitride such as SiN or another low-k dielectric such as SiCO. The liner 1012 may be conformally deposited, e.g. using atomic layer deposition (ALD). The liner 1012 may among others mask the fin structure 1010 from subsequent process steps, such as the formation of the fill layer 1014. The fill layer 1014 may be formed of a fill or process material in the form of a dielectric, e.g. an oxide such as $SiO_2$. The fill layer 1014 may be deposited over the substrate 1102, e.g. using CVD, to embed the fin structure 1010. For example, the fill layer 1014 may be formed of flowable CVD (FCVD) $SiO_2$. After the deposition, the fill layer 1014 may be planarized, e.g. using Chemical Mechanical Planarization (CMP). As shown in FIG. 6b, the fill layer 1014 may further be recessed (e.g. by CMP or etch-back) to become flush with an upper surface of the mask portion 1008, or alternatively an upper surface of the fin structure 1010 if the mask portion 1008 is removed.

According to some examples, a further recessing may, however, be omitted such that the fin structure 1010 (and mask portion 1008) remains completely covered by the fill layer 1014. According to some examples, the fill layer 1014 may also be formed by a self-planarizing spin-on layer, e.g. an organic spin-on layer such as spin-on-carbon (SOC), thus obviating the need for a CMP step after deposition.

Figure 7A:
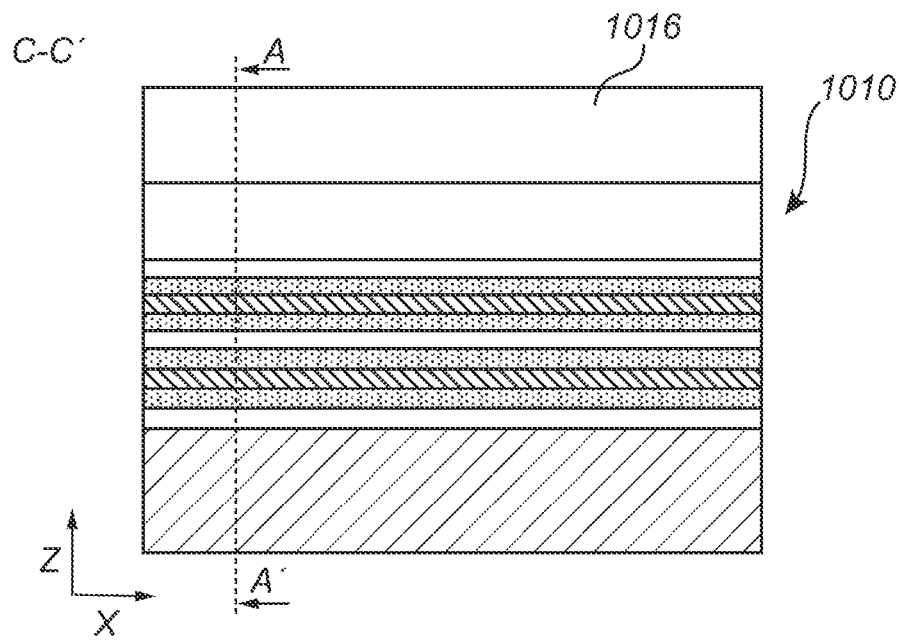
FIGS. 7a and 7b show a trench 1018 formed alongside the fin structure 1010 to expose the fin structure 1010 from the second side 1010b. In particular, the trench 1018 may be formed selectively along the second side 1010b of the fin structure 1010, for instance, along the second side 1010b but not along the directly opposite first side 1010a of the fin structure 1010.
Figure 7B:
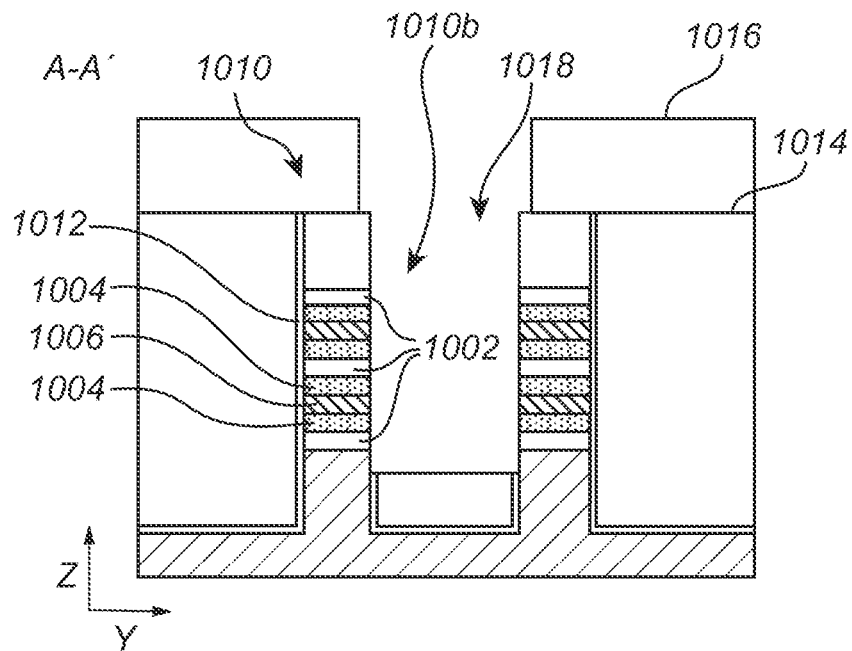

In FIGS. 7a and 7b, a trench 1018 has been formed alongside the fin structure 1010 to expose the fin structure 1010 from the second side 1010b. In particular, the trench 1018 may be formed selectively along the second side 1010b of the fin structure 1010, for instance, along the second side 1010b but not along the directly opposite first side 1010a of the fin structure 1010. As shown, the trench 1018 may be formed by etching the fill layer 1014 through an opening in a mask 1016 (a "trench etch mask 1016") formed over the fill layer 1014 and the fin structure 1010. More specifically, the opening may be defined to extend over and along the second side 1010b but not the first side 1010a of the fin structure 1010. The mask 1016 may, for example, be formed by a suitable hard mask material (e.g. oxide or nitride), wherein the opening may be defined by lithography and etching. Example etching processes for forming the trench 1018 include anisotropic etching (top-down) like RIE as well as isotropic (wet or dry) etching.

Depending on an etch contrast between the liner 1012 and the fill layer 1014 the liner 1012 may be removed from the second side surface 1010b during the etching of the fill layer 1014, or thereafter using a separate dedicated (e.g. isotropic) etch step.

The trench 1018 allows the first sacrificial layers 1002 to be accessed from the trench 1018 and etched laterally and selectively to the second sacrificial layers 1006 and the channel layers 1004. This is reflected in FIGS. 8a and 8b wherein the first sacrificial layers 1002 have been removed from the fin structure 1010 to form a set of longitudinal gaps or cavities 1020 in the fin structure 1010 at locations previously occupied by the first sacrificial layers 1002. The first sacrificial layers 1002 may be removed from the fin structure 1010 by selective etching of the first semiconductor material to the second and third semiconductor material. A (wet or dry) isotropic etching process may be used. For example, selective etching of $SiGe_z$ to $SiGe_x$ and $SiGe_y$ (with $0<=x<y<z$) may be achieved using an HCl-based dry etch, wherein a greater difference in Ge-content among the layers 1002, 1004, 1006 may confer an increased etch contrast. Selective etching using an ammonia-peroxide mixture (APM) may also be used. However, other etching processes allowing selective etching of higher Ge-content SiGe-material to lower Ge-content SiGe layers (and Si-layers) are per se known in the art and may also be employed for this purpose.

To facilitate removal of the first sacrificial layers 1002 along its full length the trench 1018 may be formed to expose the side surface 1018b of the fin structure 1010 along the full longitudinal dimension thereof.

Figure 8A:
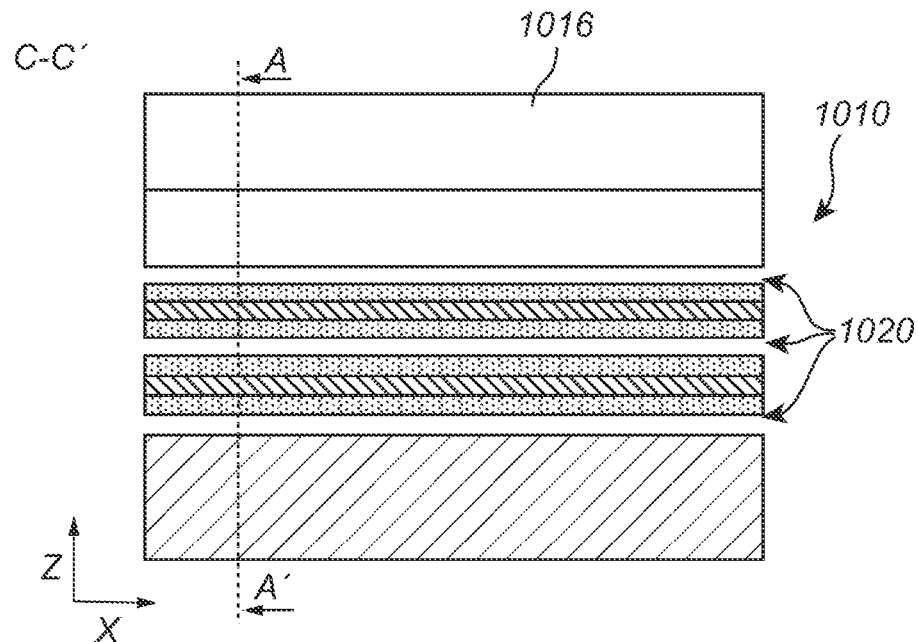
FIGS. 8a and 8b show the first sacrificial layers 1002 removed from the fin structure 1010 to form a set of longitudinal gaps or cavities 1020 in the fin structure 1010 at locations previously occupied by the first sacrificial layers 1002.
Figure 8B:
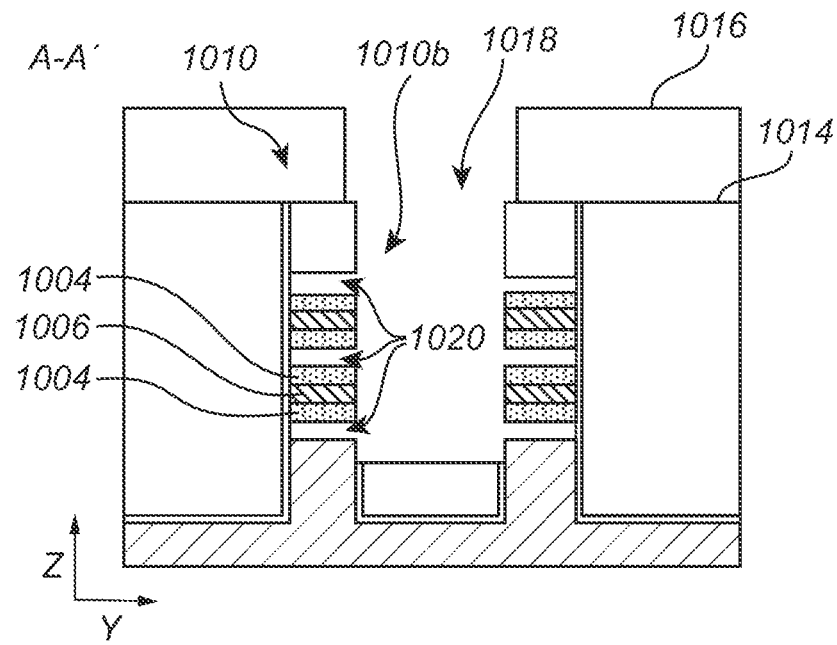

The liner 1012 and the fill layer 1014 may form a support structure supporting or tethering the fin structure 1010, thus counteracting collapse of the fin structure 1010 during and after the removal of the first sacrificial layers 1002. As shown in FIG. 8b, the mask 1016 may remain when forming the gaps 1020. However, according to alternative examples the mask 1016 may be removed, wherein the liner 1012 and the fill layer 1014 on their own may support the fin structure 1010 during removal of the first sacrificial layers 1002.

The trench 1018 may as shown be formed at a position between the pair of fin structures 1010 to expose the mutually facing side surfaces thereof. The sacrificial layers 1002 may hence be removed from two adjacent fin structures 1010 using a same trench 1018.

Figure 9A:
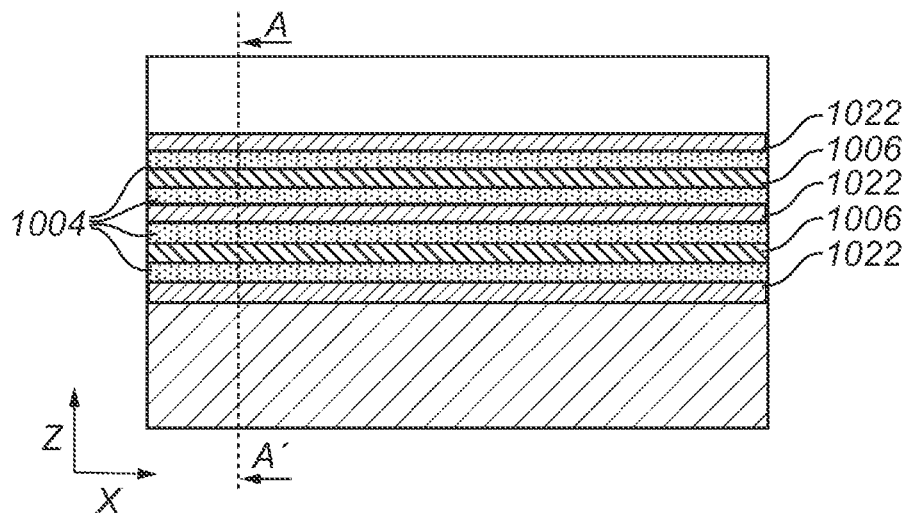
FIGS. 9a and 9b show first dielectric layers 1022 (e.g. also in the shape of nanosheets) formed in the gaps 1020 by filling the cavities with a dielectric material. The first dielectric layers 1022 may also be denoted "first non-channel layers".
Figure 9B:
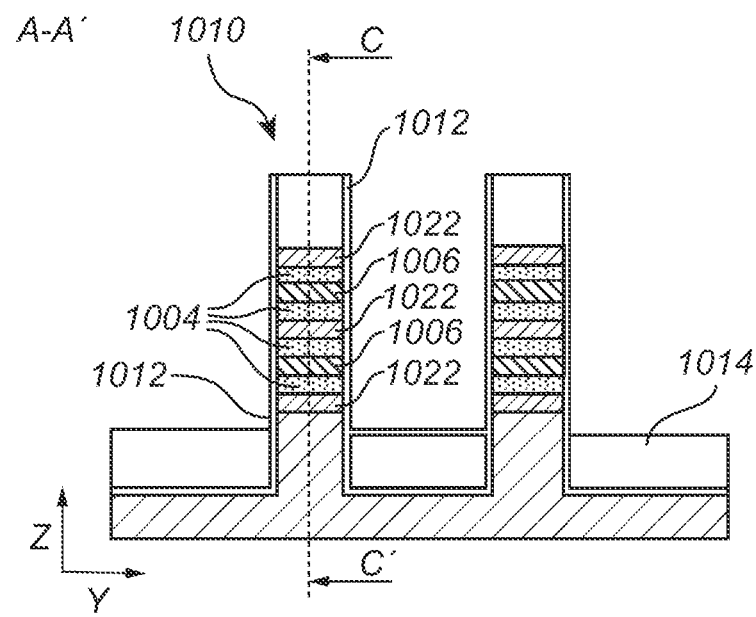

In FIGS. 9a and 9b, first dielectric layers 1022 (e.g. also in the shape of nanosheets) have been formed in the gaps 1020 by filling the cavities with a dielectric material. The first dielectric layers 1022 may also be denoted "first non-channel layers". The dielectric material may, for instance, be an oxide or a nitride material, such as $SiO_2$ or SiN or (low-k). Further examples include SiCO, SiOCN, SiCN, SION, SiBCN and SiBCNO. To facilitate subsequent selective processing steps, to be described below, the first dielectric layers 1022 may be formed of a different material than the liner 1012. For example, the liner 1012 may be formed of a nitride (e.g. SiN) and the first dielectric layers 1022 may be formed of an oxide (e.g. $SiO_2$). The dielectric material may be conformally deposited, e.g. using atomic layer deposition (ALD), such that the gaps 1020 are completely filled with the dielectric material. The deposition may be followed by an etch step (wet or dry, isotropic or anisotropic top-down) to remove dielectric material deposited outside the gaps 1020.

After forming the first dielectric layers 1022, the cover material of the liner 1012 may as shown be re-deposited along the second side 1010b (e.g. by ALD). The mask 1016 may for example be removed prior to forming the first dielectric layers 1022, or subsequent thereto and prior to re-depositing the liner 1012.

After removing the mask 1016, the fill layer 1014 may be etched back to expose the liner 1012 along the first side 1010a, thus arriving at the structure shown in FIG. 9b. According to some examples, the fill layer 1014 may instead be completely removed/etched-back and a dielectric material (e.g. $SiO_2$) may be (re-deposited) to serve as a bottom dielectric layer.

As may be appreciated from the following, the first dielectric layers 1022 may be used to form dielectric spacers between pairs of source and drain prongs and additionally passivate surfaces of the channel layers 1004 of the finished FET device. Replacing the first (semiconductor) sacrificial layers 1002 by the first dielectric layers 1022 may additionally enable an increased etch selectivity among the layers of the fin structure 1010, thus facilitating subsequent process steps.

FIGS. 10a and 10b through 12a and 12b depict process steps which may be performed to additionally introduce a longitudinal etch contrast/etch selectivity in the layers 1004, 1006, 1022 by using an ion implantation process to introduce variable etch properties along the longitudinal dimension. More specifically, as will be set out below the ion implantation process may be adapted to introduce an increased concentration of dopants in each of the first fin part 1010s and the second fin part 1010d, compared to the third fin part 1010c.

Figure 10A:
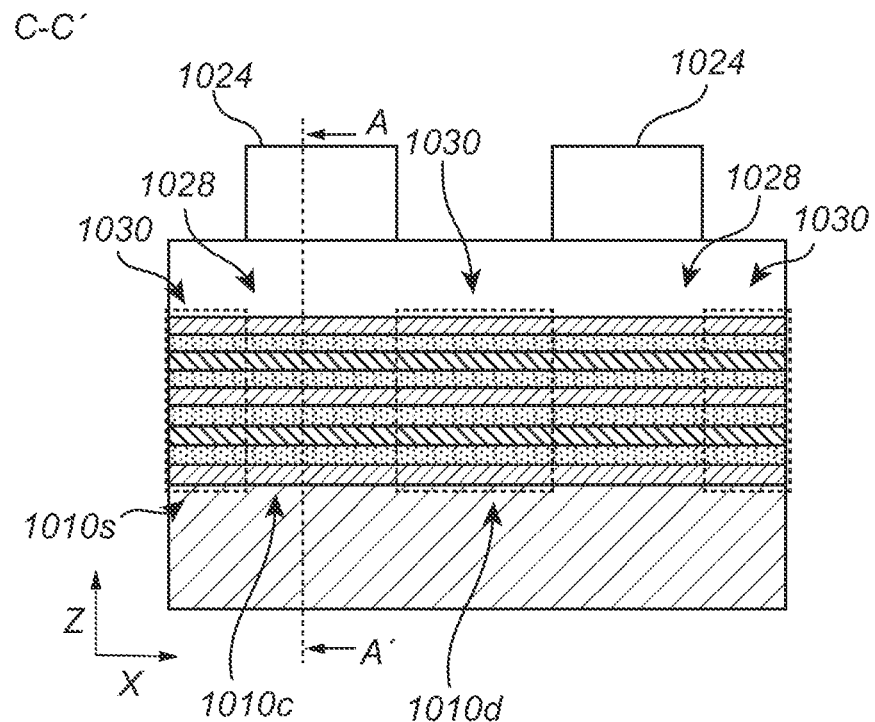
FIGS. 10a and 10b show an ion implantation mask 1024 formed across the fin structure(s) 1010 to alternatingly define masked regions 1028 and non-masked regions 1030 along the fin structure 1010. The extension of the non-masked regions 1030 are indicated by dashed bounding boxes. As indicated in FIG. 10a, one of the masked regions 1028 is defined to overlap/comprise the third fin part 1010c, while a pair of the non-masked regions 1030 are defined to overlap/comprise the first and second fin parts 1010s, 1010d.
Figure 10B:
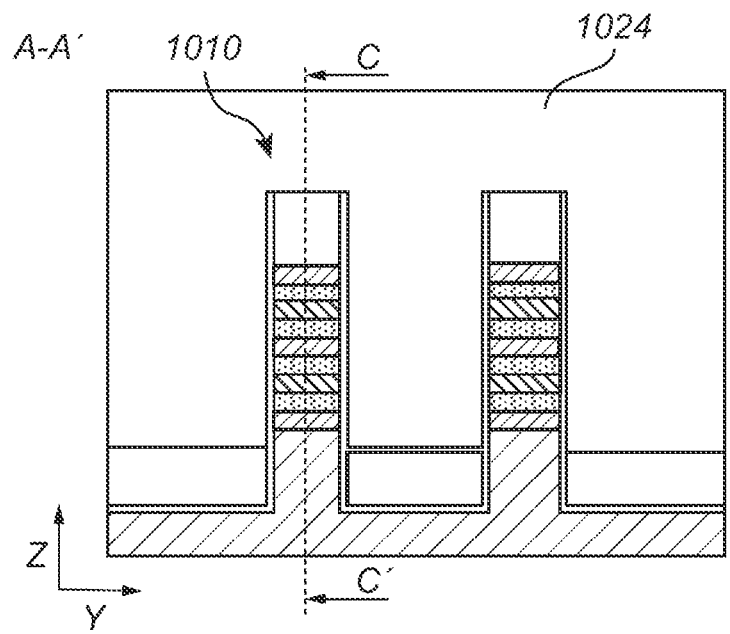

In FIGS. 10a and 10b, an ion implantation mask 1024 has been formed across the fin structure(s) 1010 to alternatingly define masked regions 1028 and non-masked regions 1030 along the fin structure 1010. The extension of the non-masked regions 1030 are indicated by dashed bounding boxes. As indicated in FIG. 10a, one of the masked regions 1028 is defined to overlap/comprise the third fin part 1010c, while a pair of the non-masked regions 1030 are defined to overlap/comprise the first and second fin parts 1010s, 1010d.

The masked regions 1028 correspond to source/drain regions of the FET to be formed, i.e. regions in which source/drain bodies will be formed. The masked regions 1030 correspond to the gate regions of the FET to be formed, for instance, regions in which gate bodies will be formed. Owing to this correspondence, each region 1028 may in the following be denoted "gate region 1028", and each region 1030 may be denoted "source/drain region 1030". In other words, the ion implantation mask 1024 may be defined to mask each gate region 1028 and expose each source/drain region 1030.

As depicted in the figures, the mask 1024 may comprise a number of mask portions, commonly referenced 1024, to define a number of masked and non-masked regions 1028 such that ion implantation may be counteracted in a number of regions or fin parts like 1010c. The mask 1024 may be formed of one or more layers of a hardmask material, for example a nitride-comprising hardmask such as SiN or a-Si. However, any conventional material suitable to form part of an ion implantation mask may be used. The mask 1024 may be patterned using single- or multi-patterning techniques.

Figure 11A:
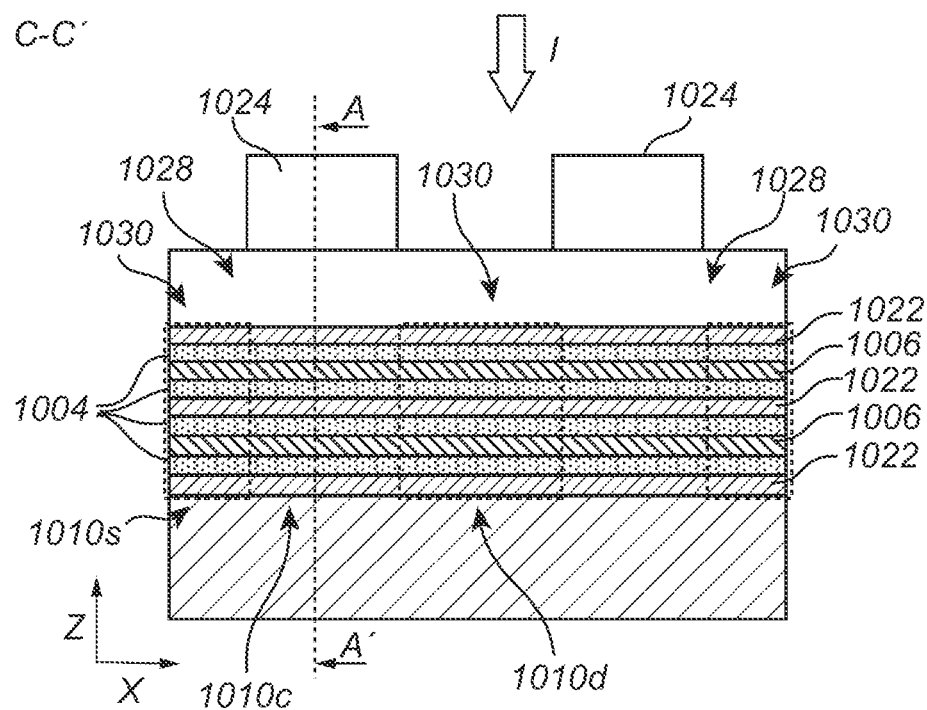
FIGS. 11a and 11b show the fin structure 1010 subjected to an ion implantation process (schematically indicated "I") wherein the first dielectric layers 1022, the second sacrificial layers 1006 and the channel layers 1004 have been provided with an increased concentration of dopants in the non-masked (source/drain) regions 1030 compared to the masked (gate) regions 1028.
Figure 11B:
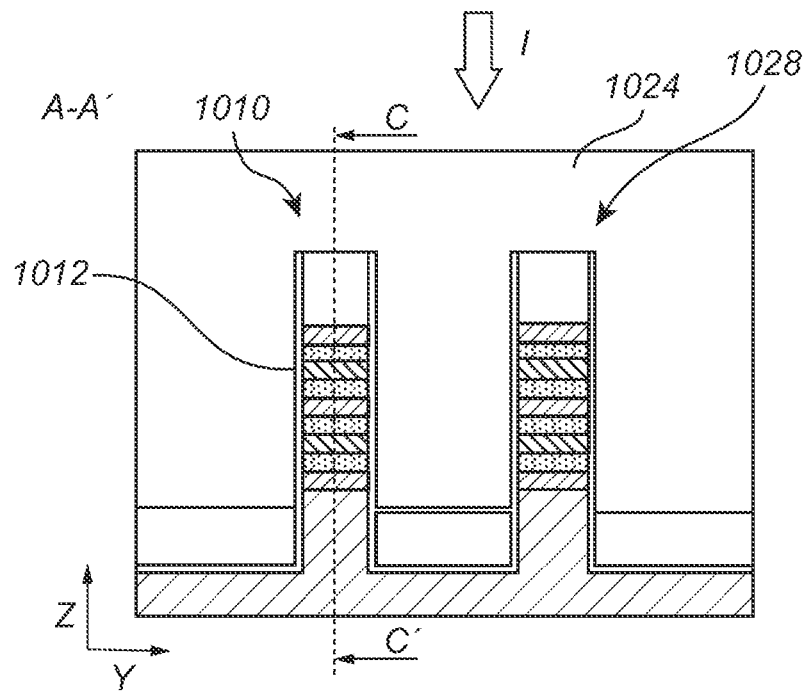

In FIGS. 11a and 11b, the fin structure 1010 has been subjected to an ion implantation process (schematically indicated "I") wherein the first dielectric layers 1022, the second sacrificial layers 1006 and the channel layers 1004 have been provided with an increased concentration of dopants in the non-masked (source/drain) regions 1030 compared to the masked (gate) regions 1028. Accordingly, the first and second fin parts 1010s, 1010d have been provided with an increased concentration of dopants compared to the third fin part 1010c. Any type of ion implant affecting the etch rate in the intended manner may be used.

Figure 12A:
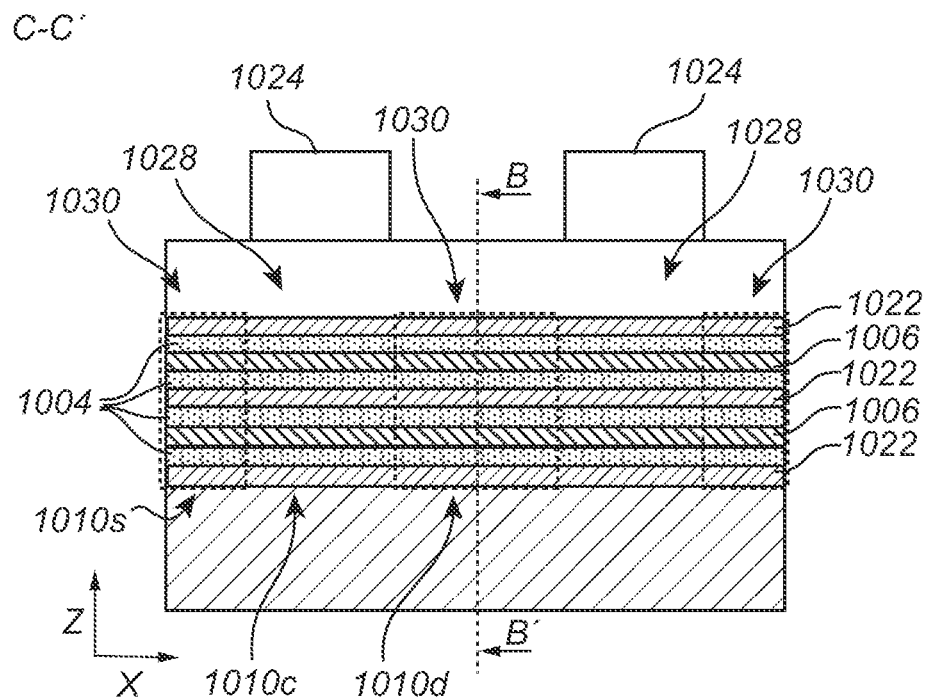
Figure 12B:
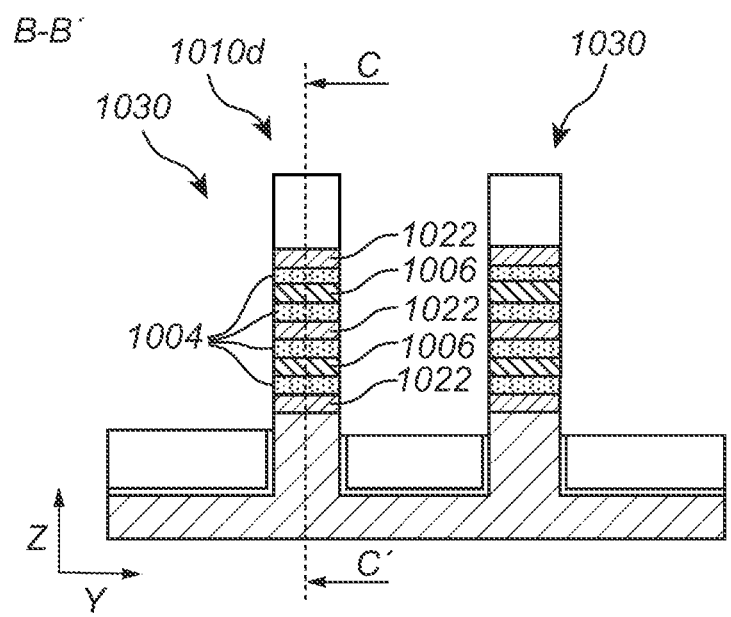
FIG. 12b shows a cross section of the fin structure(s) 1010 along the vertical plane B-B' indicated in FIG. 12a after the liner 1012 has been partially opened to expose each of the first and second fin parts 1010s, 1010d from each of the first and second sides 1010a, 1010b. The third fin part 1010c remains covered from each of the first and second sides 1010a, 1010b. As shown, the liner 1012 may be etched while using the mask 1024 extending across the fin structure 1010 as an etch mask. The side surfaces 1010a, 1010b of the fin structure 1010 may thus be exposed in regions 1030 not covered by the mask 1024.
Figure 13A:
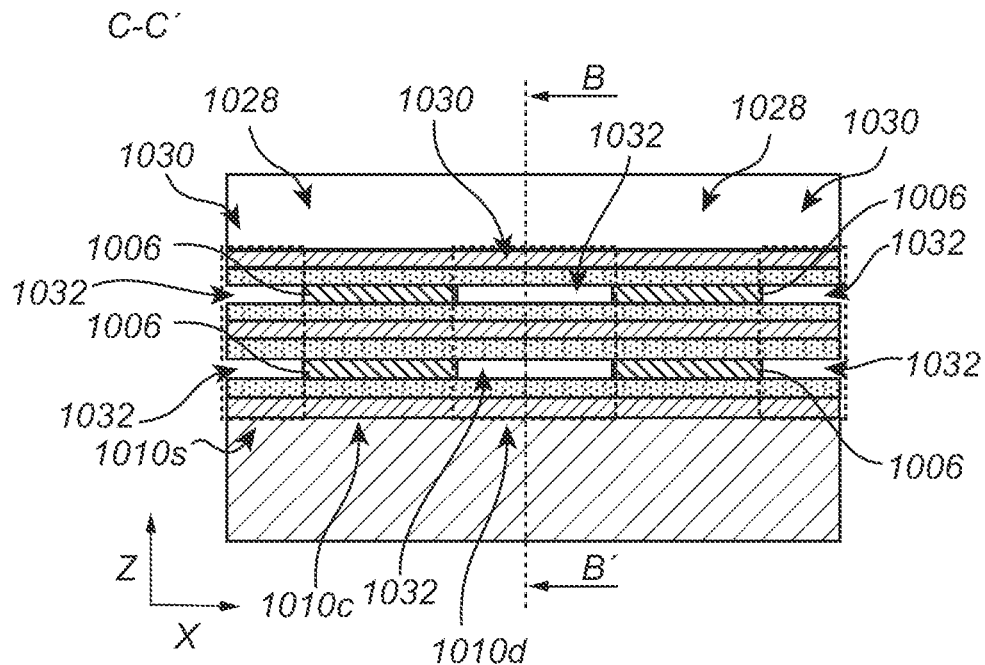
FIGS. 13a and 13b show portions of each second sacrificial layer 1006 have been removed in regions 1030 to form the cavities 1032 by etching the second sacrificial layers 1006 from both sides 1010a, 1010b. The cavities 1032 may as shown extend completely through the fin structure 1010, along the Y direction. Portions of the channel layers 1002 and first dielectric layers 1022 may remain in the regions 1030, e.g. in the first and second fin parts 1010s, 1010d. The liner 1012 remaining in the regions 1028 may provide additional support to the fin structure 1010 during and after the forming of the cavities 1032.
Figure 13B:
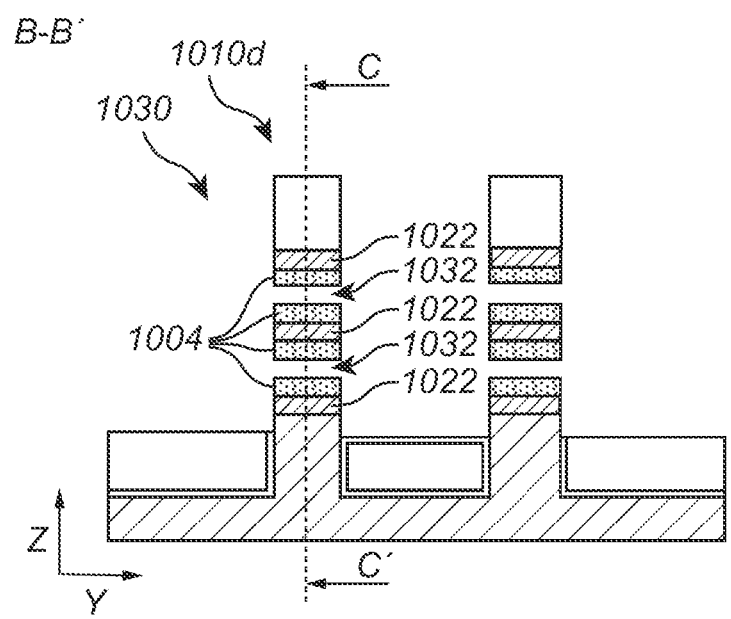

FIG. 12b depict a cross section of the fin structure(s) 1010 along the vertical plane B-B' indicated in FIG. 12a after the liner 1012 has been partially opened to expose each of the first and second fin parts 1010s, 1010d from each of the first and second sides 1010a, 1010b. The third fin part 1010c remains covered from each of the first and second sides 1010a, 1010b. As shown, the liner 1012 may be etched while using the mask 1024 extending across the fin structure 1010 as an etch mask. The side surfaces 1010a, 1010b of the fin structure 1010 may thus be exposed in regions 1030 not covered by the mask 1024. The liner 1012 may be removed using an isotropic etching process, wet or dry. The cross section of FIG. 12b shows the second fin part 1010d but is representative also for the first fin part 1010s.

In FIGS. 12a and 12b, the "ion implantation mask" 1024 is used also as an etch mask while removing the liner 1012. However, the mask 1024 may, according to other examples, be removed after the ion implantation process and a new dedicated liner opening mask extending across the fin structure(s) 1010 may be formed. The mask 1024, or the liner opening mask, may as shown be removed after opening the liner 1012. However, the mask 1024 may alternatively remain, also during the subsequent etching of the second sacrificial layers 1006 described below, to be removed thereafter.

The partially opened liner 1012 may accordingly together with the capping 1008 define a mask structure covering the fin structure 1010 from both sides 1010a, 1010b in the gate regions 1028 (e.g. the third fin part 1010c), and defining openings exposing the fin structure 1010 from both sides 1010a, 1010b in the source/drain regions 1030 (e.g. the first and second fin parts 1010s, 1010d). The mask structure thus allows the second sacrificial layers 1006 to be accessed and etched laterally and selectively to form cavities 1032 in the source/drain regions 1030, e.g. in the first and second fin parts 1010s, 1010d. This is reflected in FIGS. 13a and 13b, wherein portions of each second sacrificial layer 1006 have been removed in regions 1030 to form the cavities 1032 by etching the second sacrificial layers 1006 from both sides 1010a, 1010b. The cavities 1032 may as shown extend completely through the fin structure 1010, along the Y direction. Portions of the channel layers 1002 and first dielectric layers 1022 may remain in the regions 1030, e.g. in the first and second fin parts 1010s, 1010d. The liner 1012 remaining in the regions 1028 may provide additional support to the fin structure 1010 during and after the forming of the cavities 1032. The second sacrificial layers 1006 may be etched selectively to the first dielectric layers 1022 and the channel layers (e.g. by selective etching of the second semiconductor material to the first dielectric material and the third semiconductor material). A (wet or dry) isotropic etching process may be used. For example, selective etching of $SiGe_y$ to $SiGe_{x<y}$, $SiO_2$ and SiN may be achieved using an HCl-based dry etch or APM.

Etching the second sacrificial layers 1006 from both sides 1010a, 1010b may facilitate control of the etching profile between the portions of the second sacrificial layers 1006 being removed and those being preserved. By additionally introducing a longitudinal etch contrast/etch selectivity in the second sacrificial layers 1006 using the aforementioned ion implantation process, a tendency of an isotropic etching of the second sacrificial layers 1006 causing a curved or rounded etch front may be reduced. Moreover, the longitudinal etch contrast may facilitate localizing the forming of the cavities 1032 to the regions 1030 (e.g. to the first and second fin parts 1010s, 1010d) by providing a reduced etch rate of the un-doped portions of the second sacrificial layers 1006 in the regions 1028 (e.g. the third fin part 1010c) compared to the doped portions of the second sacrificial layers 1006 in the regions 1030 (e.g. the first and second fin parts 1010s, 1010d). Accordingly, the selective etching may further be adapted to etch the doped second semiconductor material of the first and second fin parts 1010s, 1010d selectively to the un-doped second semiconductor material of the third fin part 1010c.

It will be appreciated that by using an isotropic etching process to form the cavities 1032, a longitudinal dimension of the openings in the liner 1012 (along the X direction) may be smaller than a longitudinal dimension of the source/drain regions 1030. In other words, the openings need not be coextensive with the regions 1030 (along the X direction). This may be achieved by opening the liner 1012 as discussed in connection with FIGS. 12a and 12b using a liner opening mask with reduced dimension openings along the X direction compared to the ion implantation mask 1024.

Figure 14A:
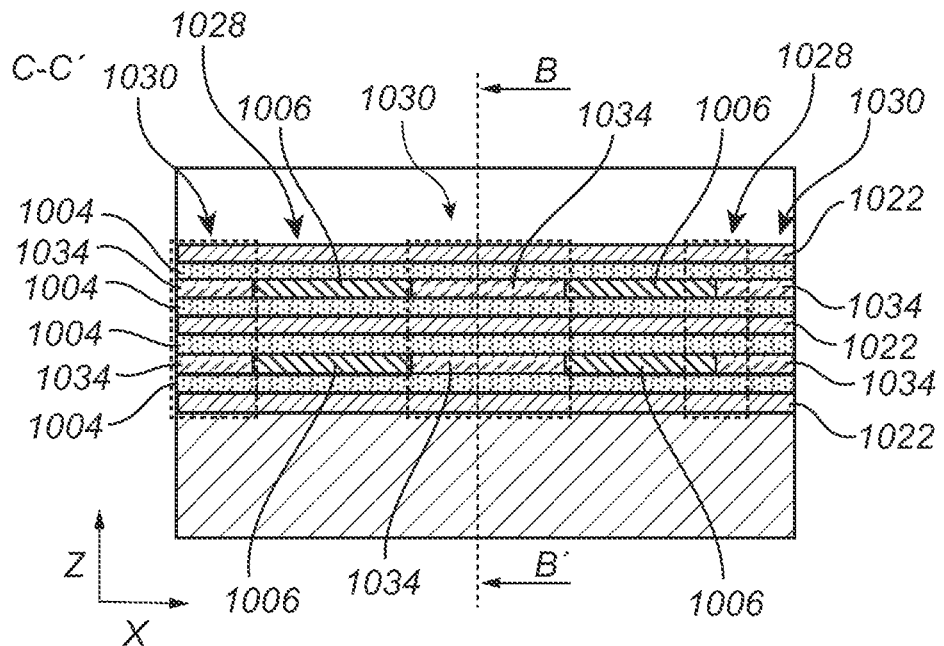
FIGS. 14a and 14b show second dielectric layers 1034 (e.g. also in the shape of nanosheets) have been formed in the cavities 1032 by filling the cavities 1032 with a second dielectric material.
Figure 14B:
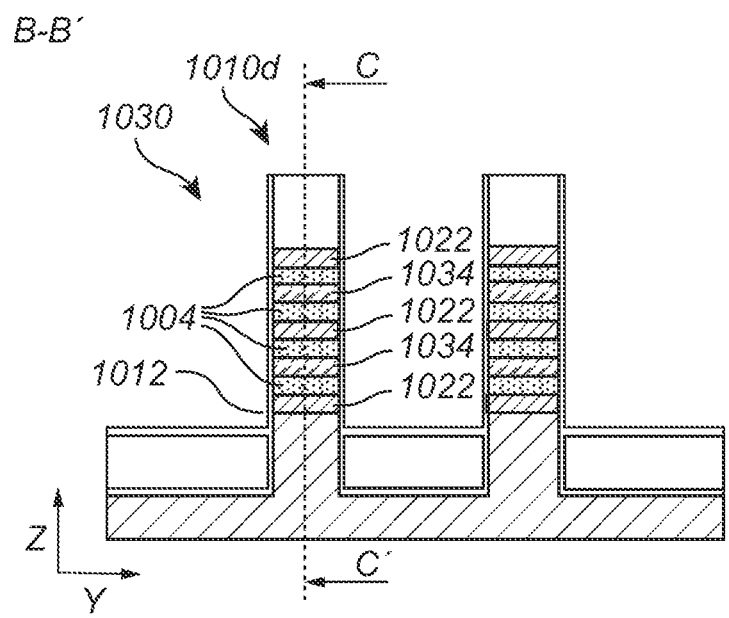

In FIGS. 14a and 14b, second dielectric layers 1034 (e.g. also in the shape of nanosheets) have been formed in the cavities 1032 by filling the cavities 1032 with a second dielectric material. The second dielectric material may, for example, be an oxide or a nitride material, such as any of the examples mentioned in connection with the liner 1012. The second dielectric layers 1034 may in particular be formed of a same material as the liner 1012. To facilitate subsequent selective processing steps, to be described below, the second dielectric layers 1034 may be formed of a different material than the first dielectric layers 1022. The (second) dielectric material may be conformally deposited, e.g. using ALD, such that the cavities 1032 are completely filled with the dielectric material. Although not reflected in FIG. 14b, the deposition may be followed by an etch step (wet or dry, isotropic or anisotropic top-down) to remove dielectric material deposited outside the cavities 1032. If the second dielectric layers are formed of different material than the liner 1012, the liner 1012 may be re-deposited along the sides of the fin structure 1010, e.g. using a separate ALD step.

Figure 15A:
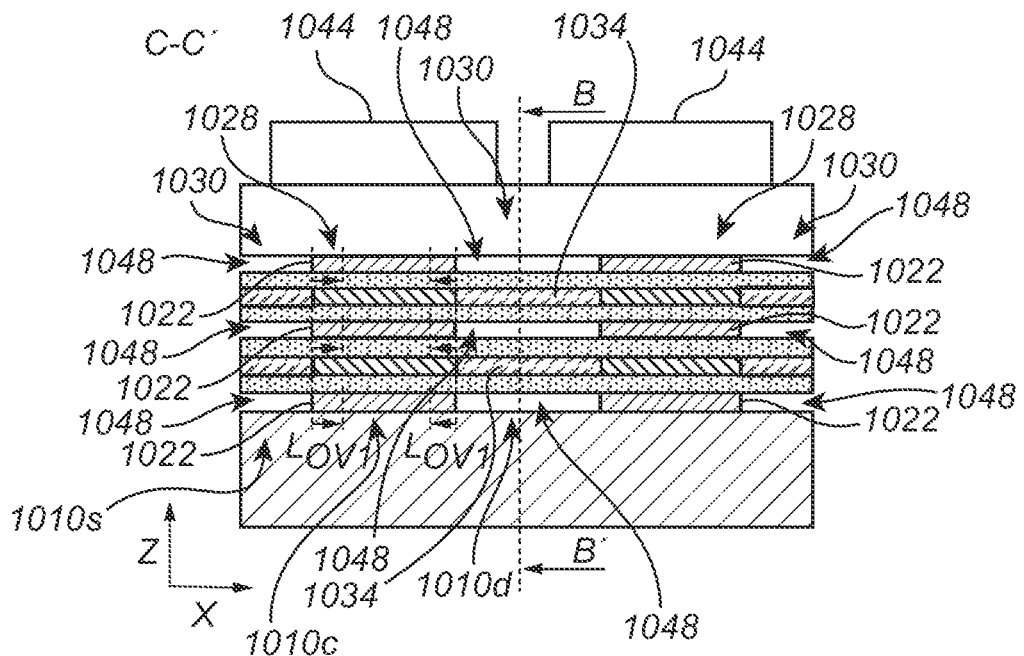
FIGS. 15a and 15b show etching each of the first and the second fin part 1010s, 1010d of the fin structure 1010 laterally from a first side 1010a such that a set of source cavities and a set of drain cavities 1048 are formed in the first fin part 1010s and the second fin part 1010d, respectively.
Figure 15B:
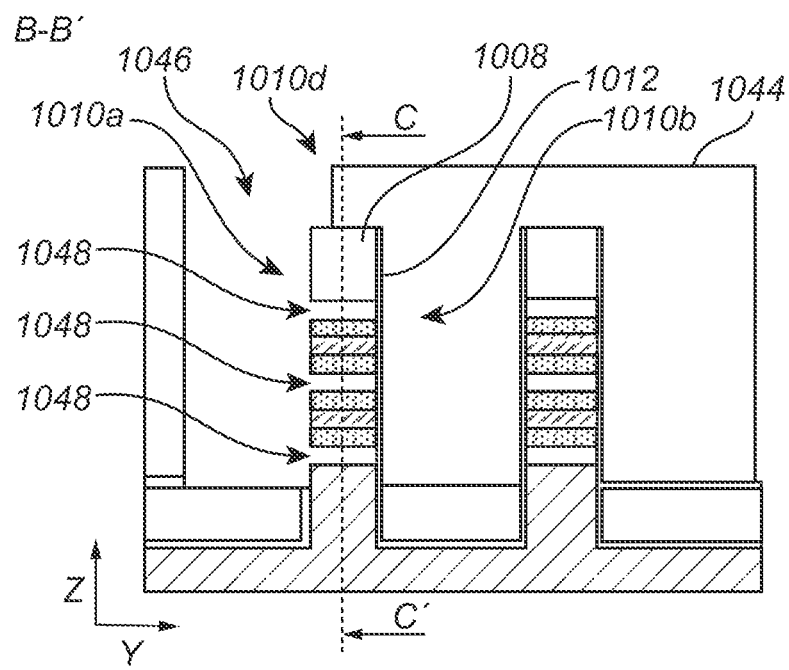
Figure 16A:
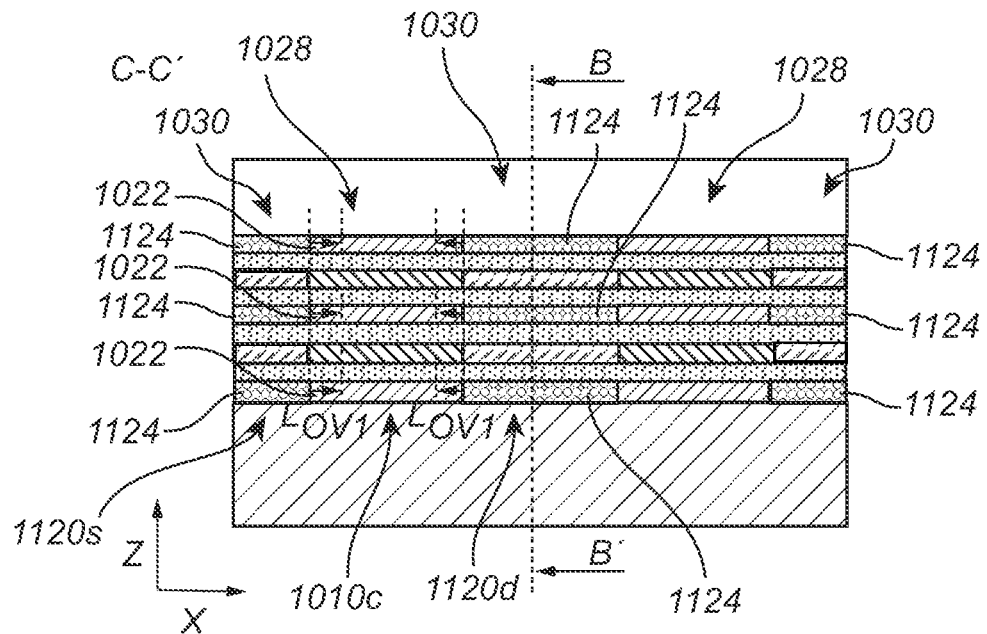
FIGS. 16a and 16b show process steps for forming a respective source/drain body along each source/drain region 1030 of the fin structure 1010 (e.g. along the first and second fin parts 1010s, 1010d). Each source/drain body may form either a source body 1120s (e.g. corresponding to source body 120 of device 100) or a drain body 1120d (e.g. corresponding to drain body 130 of device 100).

FIGS. 15a, 15b, 16a and 16b illustrate process steps for forming a respective source/drain body along each source/drain region 1030 of the fin structure 1010 (e.g. along the first and second fin parts 1010s, 1010d). Each source/drain body may form either a source body 1120s (e.g. corresponding to source body 120 of device 100) or a drain body 1120d (e.g. corresponding to drain body 130 of device 100). FIG. 16a includes the individual designations 1120s and 1120d while subsequent figures for illustrational clarity include only the common designation 1120. Each source/drain body 1120 may comprise a common semiconductor source/drain body portion 1122 arranged at the first side 1010a of the fin structure 1010, and a set of vertically spaced apart semiconductor source/drain layer portions or prongs 1124 protruding from the common source body portion 1122 in the Y direction. In FIGS. 15a, 16a and onwards, the dashed bounding boxes indicating regions 1030 have been omitted to not obscure the figures.

In FIGS. 15a and 15b, a cover material is deposited along the first and second sides 1010a, 1010b of the fin structure 1010, thereby forming a mask layer or cover layer 1044 embedding the fin structure 1010. The cover layer 1044 may be formed by a suitable cover material, such as a self-planarizing spin-on layer, e.g. an organic spin-on layer such as SOC. An opening or trench 1046 (e.g. "source/drain trench") is formed in the cover layer 1044, in each source/drain region 1030 of the fin structure 1010, along the first side 1010a but not along the directly opposite second side 1010b of the fin structure 1010. Openings or trenches 1046 have accordingly been formed in the cover material, along the first and second fin parts 1010s, 1010d, to expose each of the first and second fin parts 1010s, 1010d from only the first side 1010a.

The trenches 1046 may be formed by etching the cover layer 1044 through a respective opening in a mask (a "source/drain trench etch mask", not shown) formed over the cover layer 1044 and the fin structure 1010. Each opening may be defined to extend over and along the first side 1010a but not the second side 1010b of the fin structure 1010. The mask may, for example, be formed by a suitable hard mask material (e.g. oxide or nitride), wherein the opening may be defined by lithography and etching. Example etching processes for forming the trench 1046 include anisotropic etching (top-down) like RIE. By etching the cover layer 1044 selectively to the capping 1008 (and/or liner 1012 which may be formed on the capping 1008) the trench 1046 may be etched self-aligned with respect to the liner 1012 on the side surface 1010a of the fin structure 1010.

After forming the trenches 1046, portions of the liner 1012 exposed in each trench 1046 may be removed from the first side surface 1010a of the first and second fin parts 1010s, 1010d of the fin structure 1010. The portions of the liner 1012 may be etched using a suitable isotropic etching process (wet or dry).

The partially opened liner 1012 may accordingly together with the capping 1008 and the cover layer 1044 (if not removed) define a mask structure covering the fin structure 1010 from the second side 1010b in the source/drain regions 1030 and gate regions 1028 (e.g. the first, second and third fin parts 1010s, 1010d, 1010c), and defining openings exposing the fin structure 1010 from the first side 1010a in the source/drain regions 1030 (e.g. the first and second fin parts 1010s, 1010d). The mask structure thus allows the first dielectric layers 1022 to be accessed and etched laterally and selectively to form cavities 1048 (e.g. "source/drain cavities") in the source/drain regions 1030, e.g. in the first and second fin parts 1010s, 1010d. The side surface portions of the first dielectric layers 1022 exposed in the trenches 1046 may be laterally etched back (along the Y direction) from the trenches 1046. The first dielectric layers 1022 may be etched such that the cavities 1048 extend completely through the fin structure 1010, along the Y direction. The first dielectric layers 1022 may be etched such that portions of the first dielectric layers 1022 remain in the gate regions 1028 on opposite sides of the cavities 1048, e.g. in the third fin part 1010c. The first dielectric layers 1022 may be etched selectively to the second dielectric layers 1034 and the channel layers 1004 (e.g. by selective etching of the first dielectric material to the second dielectric material and the third semiconductor material). A (wet or dry) isotropic etching process may be used.

By introducing a longitudinal etch contrast/etch selectivity in the first dielectric layers 1022 using the aforementioned ion implantation process, a tendency of an isotropic etching of the first dielectric layers 1022 causing a curved or rounded etch front may be reduced. Moreover, the longitudinal etch contrast may facilitate forming the cavities 1048 selectively in the source/drain regions 1030 by providing a reduced etch rate of the un-doped portions of the first sacrificial layers 1022 in the gate regions 1028 compared to the doped portions of the first dielectric layers 1022 in the source/drain regions 1030. Accordingly, the selective etching may further be adapted to etch the doped first dielectric material of the first and second fin parts 1010s, 1010d (e.g. in the source/drain regions 1030) selectively to the un-doped first dielectric material of the third fin part 1010c (e.g. in the gate regions 1028).

It should be noted that by using an isotropic etching process to form the cavities 1048, a longitudinal dimension of the trenches 1046 (along the X direction) may be smaller than a longitudinal dimension of the source/drain regions 1030. In other words, the trenches 1046 need not be coextensive with the regions 1030 (along the X direction). This is also reflected in FIG. 15a wherein the cavities 1048 are shown to undercut the mask portions 1044.

Figure 16B:
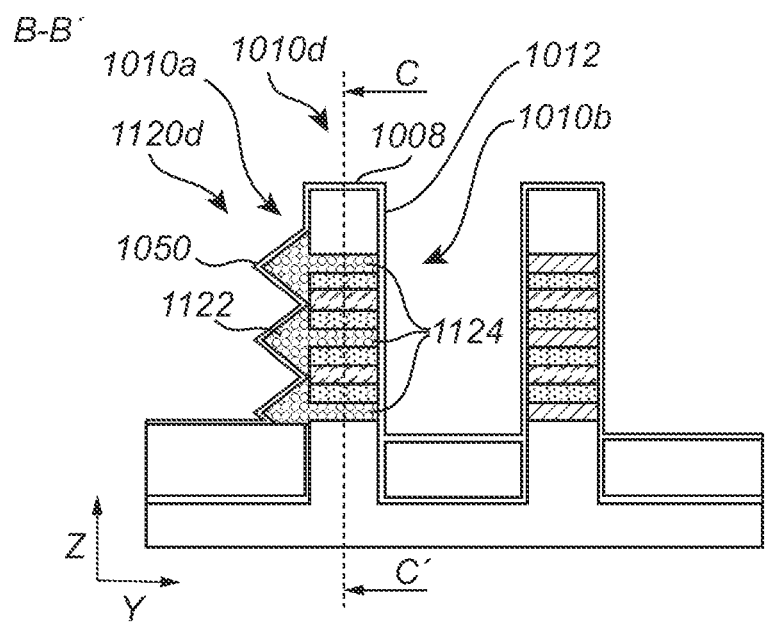

After forming the cavities 1048, source/drain material may be deposited to form the source/drain bodies 1120, as shown in FIGS. 16a and 16b. During the source/drain material deposition the cover layer 1044 and/or the liner 1012 may mask the fin structure 1010 from the second side 1010b. The cover layer 1044 may be removed prior to or subsequent to the source/drain material deposition.

The source/drain bodies 1120 may be formed by epitaxy of a semiconductor source/drain material. The epitaxy may seed from top and bottom surface portions of the channel layers 1004 exposed in the cavities 1048. The material deposited in the cavities 1048 may form prongs 1124 in contact/abutment with the channel layers 1004. The epitaxy may as shown be continued until the source/drain material protrudes from the cavities 1048 to form body portions along the first side 1010. The epitaxy may subsequently be further continued such that the (individual) body portions merges to define the common body portions 1122 along the first side 1010a. For example, Si or SiGe may be epitaxially grown in contact with Si or SiGe channel layers 1004, e.g. using selective area epitaxy. The epitaxy may comprise an initial sub-step of depositing a seed layer on the channel layers 1004 in the cavities, to facilitate growth of a remainder of the source/drain bodies 1120. The source/drain material may be doped, e.g. by in-situ doping, with an n- or p-type dopant, to form doped source/drain bodies, in contact with the channel layers.

After the epitaxy, a contact etch stop layer (CESL) may be deposited (e.g. by ALD) on the source/drain bodies 1120. In the illustrated example, the CESL may be formed of a same material as the liner 1012, and hence depicted as continuous with the liner 1012 and indicated with the same reference sign. However, the CESL may also be formed of a different suitable dielectric hard mask material. The CESL may serve as a mask for the source/drain bodies 1120 during subsequent process steps.

Figure 17A:
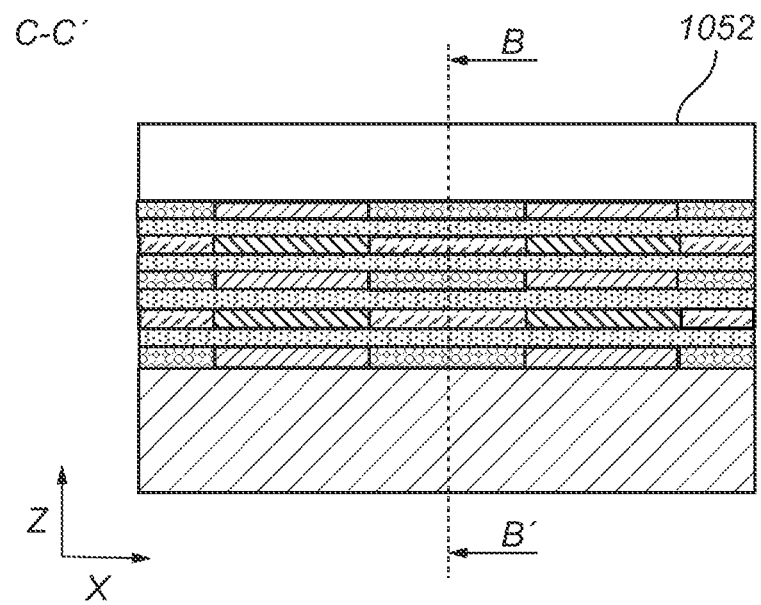
FIGS. 17a and 17b illustrate the process steps shown in FIGS. 15a and 15b through 16a and 16b may be repeated at further fin structures, such as the second fin structure 1010 (the rightmost fin structure in FIG. 17b), to form corresponding source/drain bodies 1120 along the second fin structure. The source/drain bodies 1120 along the second fin structure 1010 may, for example, be formed with an opposite doping to the source/drain bodies 1120 along the first fin structure 1010.
Figure 17B:
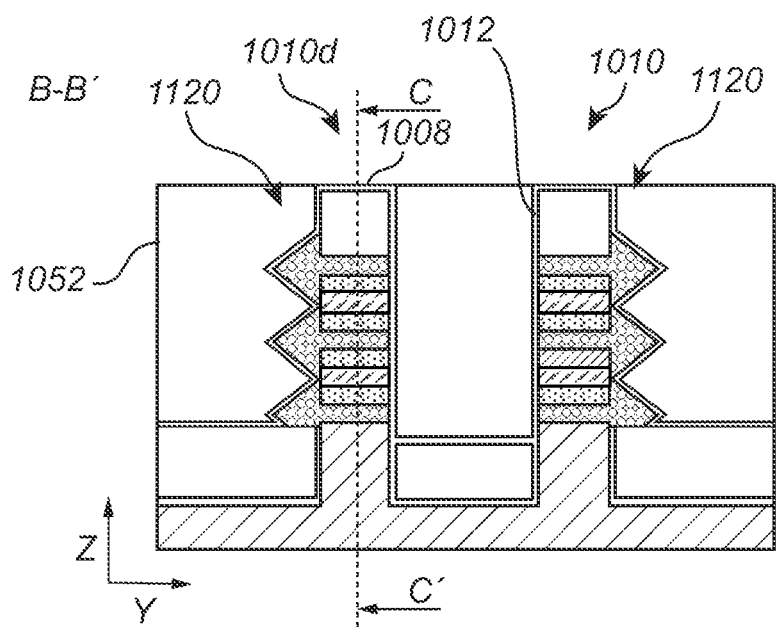

As shown in FIGS. 17a and 17b, the process steps shown in FIGS. 15a and 15b through 16a and 16b may be repeated at further fin structures, such as the second fin structure 1010 (the rightmost fin structure in FIG. 17b), to form corresponding source/drain bodies 1120 along the second fin structure. The source/drain bodies 1120 along the second fin structure 1010 may, for example, be formed with an opposite doping to the source/drain bodies 1120 along the first fin structure 1010.

After depositing the source/drain material, the fin structure 1010 may be embedded in a dielectric layer 1052, e.g. an oxide such as CVD or FCVD $SiO_2$. The dielectric layer 1052 may be recessed (e.g. by CMP and/or etch back) to bring its upper surface flush with an upper surface of the capping 1008 or (as shown) the liner 1012/CESL thereon.

FIGS. 18a, 18b, 19a and 19b illustrate process steps for forming a gate body 1140 in each gate region 1028, e.g. along the third fin part 1010c. The gate body 1140 comprises a common gate body portion 1142 arranged at the second side 1010b of the fin structure 1010, and a set of vertically spaced apart gate prongs 1144. Each gate prong 1144 protrudes from the common gate body portion 1142 in the opposite direction to the prongs 1124 (along the −Y direction) into a space above or underneath a respective channel layer 1004. In the illustrated example, the prongs 1144 in particular extend into a space between a respective pair of channel layers 1004.

Figure 18A:
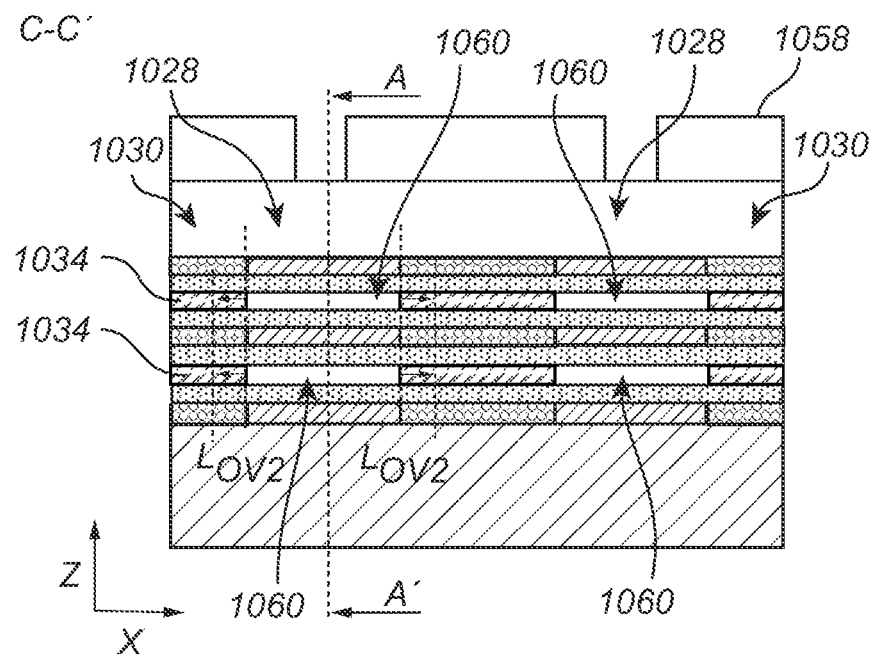
FIGS. 18a and 18b show a trench 1056 (e.g. "gate trench") formed alongside the fin structure 1010 in each gate region 1028, along the second side 1010b thereof. An opening or trench 1056 has accordingly been formed in the dielectric layer 1052 along the third fin part 1010c, to expose the third fin part 1010c from only the second side 1010b.
Figure 18B:
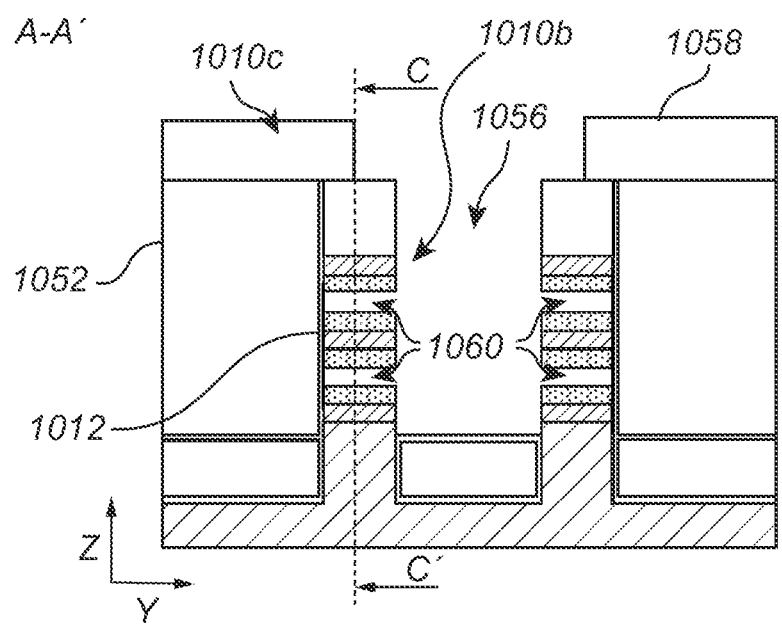

In FIGS. 18a and 18b, a trench 1056 (e.g. "gate trench") has been formed alongside the fin structure 1010 in each gate region 1028, along the second side 1010b thereof. An opening or trench 1056 has accordingly been formed in the dielectric layer 1052 along the third fin part 1010c, to expose the third fin part 1010c from only the second side 1010b.

The trench 1056 may as shown be formed by etching the dielectric layer 1052 through an opening in a mask 1058 (a "gate trench etch mask 1058") formed over the dielectric layer 1052 and the fin structure 1010. More specifically, the opening may be defined to extend over and along the second side 1010b but not the first side 1010a of the fin structure 1010. The mask 1058 and trench 1056 may be formed and etched respectively in a same manner as the source/drain trench etch mask and the source/drain trench 1046, respectively.

Depending on an etch contrast between the liner 1012 and the dielectric layer 1052 the liner 1012 may be removed from the second side surface 1010b during the etching of the dielectric layer 1052, or thereafter using a separate dedicated (e.g. isotropic) etch step.

The partially opened liner 1012 may accordingly together with the capping 1008, the dielectric layer 1052 and the gate trench etch mask 1058 (if not removed) define a mask structure covering the fin structure 1010 from the first side 1010b in the source/drain regions 1030 and gate regions 1028 (e.g. the first, second and third fin parts 1010s, 1010d, 1010c), and defining openings exposing the fin structure 1010 from the second side 1010b in the gate regions 1028 (e.g. the third fin part 1010c). The mask structure thus allows the portions of the second sacrificial layers 1006 remaining in the gate regions 1028 (e.g. the third fin part 1010c) to be accessed from the trench 1056 and etched laterally and selectively form cavities 1060 (e.g. "gate cavities") in the gate regions 1028, e.g. the third fin part 1010c. The side surfaces of the portions of the second sacrificial layers 1006 exposed in the trench 1056 may be laterally etched back (along the −Y direction) from the trench 1056. The portions of the second sacrificial layers 1006 may be etched such that the cavities 1060 extend completely through the fin structure 1010, along the −Y direction. The etch may continue until the portions of the second sacrificial layers 1006 are removed from the fin structure 1010 (i.e. completely).

As may be appreciated from the above, the remaining portions of the second sacrificial/non-channel layers 1006 correspond to portions of the second sacrificial layers 1006 which have not been replaced by second dielectric layers 1034 and may hence be of the second semiconductor material, and in particular be undoped. The portions 1006 may hence be removed from the fin structure 1010 by selective etching of the second semiconductor material (e.g. being un-doped) to the first dielectric material and the third semiconductor material.

As the portions of the second sacrificial layers 1006 remaining prior to forming the cavities 1060 are surrounded by the second dielectric layers 1034 on either side (as viewed along the longitudinal direction of the fin structure 1010, i.e. the X direction), the cavity etch may be confined to the regions 1028, e.g. the third fin part 1010c. The second semiconductor material may hence further be etched selectively to the second dielectric material such that the second dielectric layers 1034 may be used as etch stop layers along the longitudinal direction X of the fin structure 1010. A (wet or dry) isotropic etching process may be used. For example, selective etching of $SiGe_y$ to $SiGe_x$ (with 0≤ x<y) may as discussed above be achieved e.g. using an HCl-based dry etch.

Figure 19A:
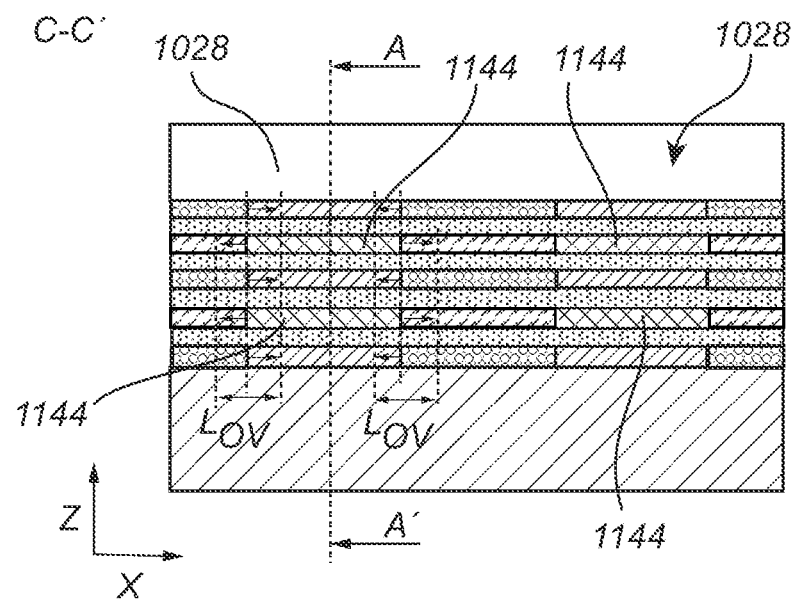
FIGS. 19a and 19b show the gate body 1140 has been formed, comprising the set of gate prongs 1144 in the cavities 1060, and the common gate body portion 1142 in the trench 1056, merging the gate prongs 1144. For illustrational clarity, the gate body 1140 may be depicted as a single piece-body, however it may be formed by depositing a stack of gate materials (a "gate stack") comprising a gate dielectric layer, and one or more gate metals.
Figure 19B:
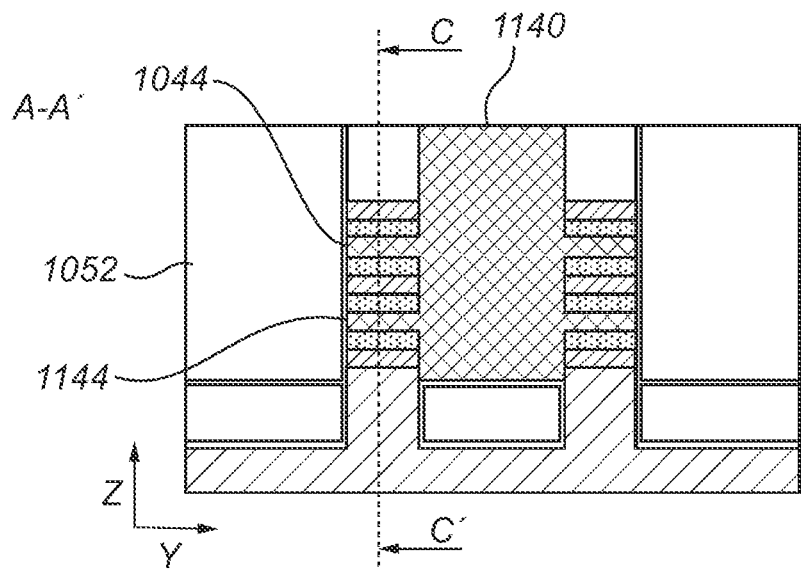

In FIGS. 19a and 19b, the gate body 1140 has been formed, comprising the set of gate prongs 1144 in the cavities 1060, and the common gate body portion 1142 in the trench 1056, merging the gate prongs 1144. For illustrational clarity, the gate body 1140 may be depicted as a single piece-body, however it may be formed by depositing a stack of gate materials (a "gate stack") comprising a gate dielectric layer, and one or more gate metals. The gate dielectric layer may be a conventional gate dielectric of a high-k, such as $HfO_2$, LaO, AlO and ZrO. Examples of gate metals include conventional work function metals, such as TiN, TaN, TiAl, TiAlC or WCN, or combinations thereof, and gate fill materials such as W and Al. At least the gate dielectric layer and the WFM layer(s) may be conformally deposited, e.g. by ALD, to facilitate deposition within the cavities 1060. During the gate formation, the fin structure 1010 may be masked from the first side 1010a by the dielectric layer 1052, such that the common gate body portion 1142 is formed selectively along the second side 1010b.

The gate metal(s) may be recessed using e.g. CMP and/or a metal etch back process to form recessed gates 1140. The gates 1140 may as shown be recessed to bring its upper surface flush with an upper surface of the dielectric layer 1052. According to other examples, the gates 1140 may be recessed to a level below the upper surface of the dielectric layer 1052 and then then be covered by a dielectric to restore the dielectric layer 1052 over the gates 1140.

As shown in FIG. 18b, the trench 1056 may be formed at a position between the pair of fin structures 1010 to expose the mutually facing side surfaces thereof. Cavities 1060 may hence be formed in two adjacent fin structures 1010 using a same trench 1056 wherein the gate body 1140 may be shared by the adjacent fin structures 1010.

As discussed with reference to the FET device 100, the gate prongs 144 and source/drain prongs 124/34 may be arranged to overlap respective common regions 150as/150ad of each channel layer 150a. According to the example process, such a configuration may be facilitated by forming the cavities 1048 to extend into the gate regions 1028/the third fin part 1010c and/or the cavities 1060 to extend into the source/drain regions 1030/the first and second fin parts 1010s, 1010d. As schematically indicated by the dashed lines in FIGS. 15a and 16a, the cavities 1048 may be extended by etching the first dielectric layers 1022 by an additional amount Lov1 along the X and −X directions, thereby enabling forming of correspondingly extended/elongated source/drain prongs 1124. Correspondingly, as schematically indicated by the dashed lines in FIGS. 18a and 19a, the cavities 1060 may be extended by partially etching the second dielectric layers 1034 by an additional amount Lov2 along the X and −X directions, thereby enabling forming of correspondingly extended/elongated gate prongs 1144. FIG. 19a schematically indicates the combined length Lov=Lov1+Lov2 of the common overlap regions which may be obtained in this manner. As discussed above, the isotropic nature of these etching processes may result in rounded profiles of the cavities 1048, 1060. Hence, the overlap lengths Lov, Lov1 and/or Lov2 may each be understood as denoting maximum overlap lengths within the fin structure 1010, and that the precise overlap lengths may vary along the width direction Y of the fin structure 1010.

Figure 20A:
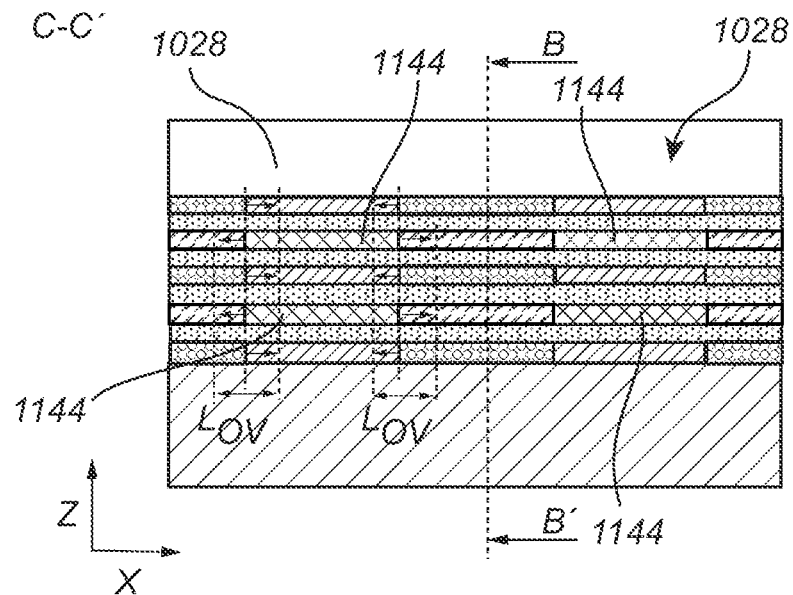
Figure 20B:
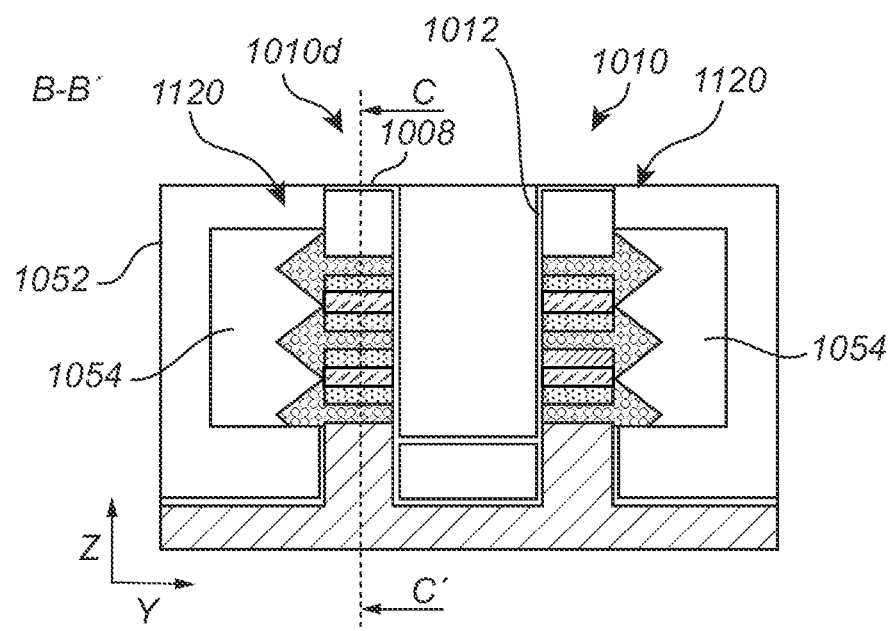

In FIGS. 20a and 20b, source/drain contacts 1054 have been formed on the source/drain bodies 1120. The contacts 1054 may (as shown) be formed as wrap-around contacts, i.e. wrapping around the common body portions 1122. Source/drain contact trenches may be patterned in the dielectric layer 1052 and the liner 1012/CESL may be opened along the first side 1010a (e.g. using lithography and etching) and one or more contact metals may be deposited therein to form the source/drain contacts 1054. Examples of contact metals include W, Al, Ru, Mo and Co. The contact metal(s) may be recessed using a metal etch back process to form recessed contacts 1054. The recessed contacts 1054 may then be covered by a dielectric to restore the dielectric layer 1052 over the source/drain contacts 1054. CMP may be applied to the dielectric layer 1052. The dielectric layer 1052 may as shown be recessed (e.g. by CMP and/or etch back) to bring its upper surface flush with an upper surface of the capping 1008.

In the above, a process for forming a FET device has mainly been described with reference to a limited number of examples. However, as is readily appreciated by a person skilled in the art, other examples than the ones disclosed above are equally possible.

For example, the epitaxy of the source/drain bodies 1120 discussed with reference to FIGS. 16a and 16b may be stopped before forming merged common semiconductor body portions 1122. In this case, the (metal) source/drain contacts 1054 may define common (metal) body portions 1122, wrapping around ends of the prongs 1124. Also in a case where merged common semiconductor body portion 1122 are formed, the contacts 1054 may be considered to form part of the common body portions 1122, wherein the common body portions 1112 may be formed as combined semiconductor-metal common body portions.

According to a further example, instead of epitaxial source/drain body portions and/or prongs, metal source/drain bodies 1120 comprising metal source/drain prongs 1124 and metal source/drain body portions 1122 may be formed, e.g. by depositing metal in the cavities 1048 and trenches 1046. Metal source/drain prongs 1124 may, for example, be combined with channel layers formed by thin-film or 2D materials, such as a transition metal dichalcogenide ($MX_2$) or IGZO.

According to a further example, an ion implantation process may be omitted. This may result in an overall reduction of process complexity, albeit at a cost of less precise control during e.g. the etching of the cavities 1032, 1048 and 1060. The method may, according to such an example, proceed directly from the stage depicted in FIGS. 9a and 9b to the stage depicted in FIGS. 12a and 12b wherein the liner 1012 has been partially opened. The liner 1012 may in this case be opened using the above discussed dedicated liner opening mask defined for the purpose of opening the liner 1012 to expose each of the first and second fin parts 1010s, 1010d in a respective source/drain region 1030 on opposite sides of a gate region 1028. The method may then proceed as further outlined above in connection with FIGS. 13a and 13b and onwards with the difference that there will be no difference in doping concentrations between the first, second and third parts 1010s, 1010d, 1010c.

According to an alternative to the process steps discussed with reference to FIGS. 8a, 8b, 9a and 9b, comprising replacing the first sacrificial layers 1002 of the first semiconductor material with the first dielectric layers 1022 of the first dielectric material shown, a fin structure 1010 with the layer structure shown in FIGS. 9a and 9b may instead be formed by patterning such a fin structure in a multi-layered SOI structure formed by epitaxy and/or layer transfer techniques (e.g. $Si/SiO_2/Si/SiGe/SiO_2/Si/SiGe$).

According to an alternative to the process steps discussed with reference to FIGS. 15a and 15b and onwards, a dielectric cover layer corresponding to layer 1052 may be formed instead of the cover layer 1044. Trenches corresponding to trenches 1046 may then be formed in the dielectric cover layer, cavities 1048 may be formed and source/drain bodies 1120 may be formed in the cavities 1048 and the trenches. The trenches may be filled with dielectric to restore the cover layer. Contact trenches may subsequently be formed and source/drain contacts may be formed therein (e.g. after repeating the processing at further fin structures).

The invention claimed is:

1. A field-effect transistor (FET) device comprising:
    a substrate, a source body, a drain body and a set of vertically spaced apart channel layers extending between the source body and the drain body in a first direction along the substrate,
        the source body comprising a common source body portion arranged at a first lateral side of the set of channel layers and a set of vertically spaced apart source prongs protruding from the common source body portion in a second direction along the substrate, transverse to the first direction,
        the drain body comprising a common drain body portion arranged at the first lateral side of the set of channel layers and a set of drain prongs protruding from the common drain body portion in the second direction; and
    a gate body comprising a common gate body portion arranged at a second lateral side of the set of channel layers, opposite the first lateral side, and a set of gate prongs protruding from the common gate body gate portion in a third direction along the substrate, opposite the first direction;
    wherein each channel layer comprises a first side and an opposite second side, the first side arranged in abutment with a topside or an underside of a pair of source and drain prongs and the second side facing a gate prong.

2. The FET device according to claim 1, wherein the gate prong and the source prong of the pair of source and drain prongs are arranged to overlap with a first common region of the channel layer such that the first common region is located vertically between the source prong and the gate prong, and wherein the gate prong and the drain prong of the pair of source and drain prongs are arranged to overlap with a second common region of the channel layer, such that that the second common region is located vertically between the drain prong and the gate prong.

3. The FET device according to claim 1, wherein the common gate body portion extends along first and second common regions of each channel layer.

4. The FET device according to claim 1, further comprising a set of vertically spaced apart insulating spacer layers, each spacer layer arranged level with and between a respective pair of the source and drain prongs.

5. The FET device according to claim 1, wherein the set of channel layers comprises a pair of channel layers arranged in abutment with a same pair of source and drain prongs from mutually opposite sides thereof such that the pair of source and drain prongs are sandwiched between the pair of channel layers.

6. The FET device according to claim 5, wherein the gate body comprises a pair of gate prongs and wherein the pair of channel layers extend through a space between the pair of gate prongs.

7. The FET device according to claim 6, wherein the set of channel layers comprises at least one further channel layer arranged in abutment with a topside or underside of a further pair of source and drain prongs, and wherein a gate prong of the pair of gate prongs is arranged between the further channel layer and one channel layer of the pair of channel layers.

8. The FET device according to claim 1, further comprising first dielectric layer portions arranged alternatingly with the source prongs and second dielectric layer portions arranged alternatingly with the drain prongs, such that each gate prong is arranged between a first and second dielectric layer portion.

9. The FET device according to claim 1, wherein the channel layers are formed by Si-comprising layers.

10. The FET device according to claim 1, wherein the source and drain prongs comprise semiconductor material and the common source and drain body portions comprise semiconductor material and/or metal.

11. The FET device according to claim 1, wherein the source and drain bodies are metal bodies.

12. An arrangement of a first and a second FET device, each according to claim 1, arranged beside each other, wherein the gate body of the first FET device and the gate body of the second FET device share a common gate body portion arranged intermediate the respective channel layers of the first FET device and the second FET device, wherein the gate prongs of the first FET device and second FET device protrude from the shared common gate body portion in opposite directions.

13. The arrangement according to claim 12, wherein the gate prong and the source prong of the pair of source and drain prongs are arranged to overlap with a first common region of the channel layer such that the first common region is located vertically between the source prong and the gate prong, and wherein the gate prong and the drain prong of the pair of source and drain prongs are arranged to overlap with a second common region of the channel layer, such that the second common region is located vertically between the drain prong and the gate prong.

14. The arrangement according to claim 12, wherein the common gate body portion extends along the first and second common regions of each channel layer.

15. The arrangement according to claim 12, further comprising a set of vertically spaced apart insulating spacer layers, each spacer layer arranged level with and between a respective pair of the source and drain prongs.

16. The arrangement according to claim 12, wherein the set of channel layers comprises a pair of channel layers arranged in abutment with a same pair of source and drain prongs from mutually opposite sides thereof such that the pair of source and drain prongs are sandwiched between the pair of channel layers.

17. The arrangement according to claim 16, wherein the gate body comprises a pair of gate prongs and wherein the pair of channel layers extend through a space between the pair of gate prongs.

18. The arrangement according to claim 17, wherein the set of channel layers comprises at least one further channel layer arranged in abutment with a topside or underside of a further pair of source and drain prongs, and wherein a gate prong of the pair of gate prongs is arranged between the further channel layer and one channel layer of the pair of channel layers.

19. The arrangement according to claim 12, further comprising first dielectric layer portions arranged alternatingly with the source prongs and second dielectric layer portions arranged alternatingly with the drain prongs, such that each gate prong is arranged between a first and second dielectric layer portion.

20. The arrangement according to claim 12, wherein the channel layers are formed by Si-comprising layers.

21. The arrangement according to claim 12, wherein the source and drain prongs comprise semiconductor material and the common source and drain body portions comprise semiconductor material and/or metal.

22. The arrangement according to claim 12, wherein the source and drain bodies are metal bodies.

* * * * *